(12) United States Patent
Pachamuthu et al.

(10) Patent No.: US 9,230,973 B2
(45) Date of Patent: Jan. 5, 2016

(54) METHODS OF FABRICATING A THREE-DIMENSIONAL NON-VOLATILE MEMORY DEVICE

(71) Applicant: SanDisk Technologies, Inc., Plano, TX (US)

(72) Inventors: Jayavel Pachamuthu, San Jose, CA (US); Johann Alsmeier, San Jose, CA (US); Raghuveer S. Makala, Campbell, CA (US); Yao-Sheng Lee, Tampa, FL (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/264,262

(22) Filed: Apr. 29, 2014

(65) Prior Publication Data

US 2015/0079742 A1    Mar. 19, 2015

Related U.S. Application Data

(60) Provisional application No. 61/879,074, filed on Sep. 17, 2013.

(51) Int. Cl.

| | | |
|---|---|---|
| *H01L 27/105* | (2006.01) | |
| *H01L 27/115* | (2006.01) | |
| *H01L 21/02* | (2006.01) | |
| *H01L 27/112* | (2006.01) | |
| *H01L 27/06* | (2006.01) | |
| *H01L 27/10* | (2006.01) | |

(Continued)

(52) U.S. Cl.
CPC ........ *H01L 27/11551* (2013.01); *H01L 21/022* (2013.01); *H01L 27/0688* (2013.01); *H01L 27/101* (2013.01); *H01L 27/1052* (2013.01); *H01L 27/1128* (2013.01); *H01L 27/11556* (2013.01); *H01L 27/11578* (2013.01); *H01L 27/11582* (2013.01); *H01L 29/66825* (2013.01);

(Continued)

(58) Field of Classification Search
CPC ....... H01L 21/64; H01L 21/70; H01L 21/702; H01L 27/11213; H01L 27/1128
See application file for complete search history.

(56) References Cited

U.S. PATENT DOCUMENTS

| | | |
|---|---|---|
| 5,084,417 A | 1/1992 | Joshi et al. |
| 5,807,788 A | 9/1998 | Brodsky et al. |

(Continued)

FOREIGN PATENT DOCUMENTS

WO    WO02/15277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Cheung Lee
(74) *Attorney, Agent, or Firm* — The Marbury Law Group PLLC

(57) ABSTRACT

A method of fabricating a semiconductor device, such as a three-dimensional NAND memory string, includes forming a first stack of alternating layers of a first material and a second material different from the first material over a substrate, removing a portion of the first stack to form a first trench, filling the trench with a sacrificial material, forming a second stack of alternating layers of the first material and the second material over the first stack and the sacrificial material, removing a portion of the second stack to the sacrificial material to form a second trench, and removing the sacrificial material to form a continuous trench through the first stack and the second stack.

28 Claims, 19 Drawing Sheets

(51) Int. Cl.
*H01L 29/66* (2006.01)
*H01L 29/792* (2006.01)
*H01L 21/306* (2006.01)

(52) U.S. Cl.
CPC ...... *H01L 29/66833* (2013.01); *H01L 29/7926* (2013.01); *H01L 21/30604* (2013.01)

(56) References Cited

U.S. PATENT DOCUMENTS

| | | | |
|---|---|---|---|
| 5,915,167 | A | 6/1999 | Leedy |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 2007/0210338 | A1 | 9/2007 | Orlowski |
| 2007/0252201 | A1 | 11/2007 | Kito et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0018052 | A1 | 1/2011 | Fujiwara et al. |
| 2011/0065270 | A1 | 3/2011 | Shim et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2011/0287612 | A1 | 11/2011 | Lee et al. |
| 2012/0001247 | A1 | 1/2012 | Alsmeier |
| 2012/0001249 | A1 | 1/2012 | Alsmeier |
| 2012/0256247 | A1 | 10/2012 | Alsmeier |
| 2012/0276719 | A1 | 11/2012 | Han et al. |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

U.S. Appl. No. 13/762,988, filed Feb. 8, 2013, SanDisk Technologies, Inc.

U.S. Appl. No. 14/133,979, filed Dec. 19, 2013, SanDisk Technologies, Inc.

U.S. Appl. No. 14/264,312, filed Apr. 29, 2014, SanDisk Technologies, Inc.

U.S. Appl. No. 14/264,407, filed Apr. 29, 2014, SanDisk Technologies, Inc.

U.S. Appl. No. 14/183,152, filed Feb. 18, 2014, SanDisk Technologies, Inc.

U.S. Appl. No. 14/225,116, filed Mar. 25, 2014, SanDisk Technologies, Inc.

U.S. Appl. No. 14/225,176, filed Mar. 25, 2014, SanDisk Technologies, Inc.

Invitation to Pay Additional Fees & Partial International Search Report, PCT/US2014/053055, Dec. 4, 2014.

U.S. Appl. No. 14/264,312, Notice of Allowance, issued Feb. 11, 2015, 12pgs.

International Search Report and Written Opinion received in connection with international application No. PCT/US2014/053055; mailed Mar. 30, 2015.

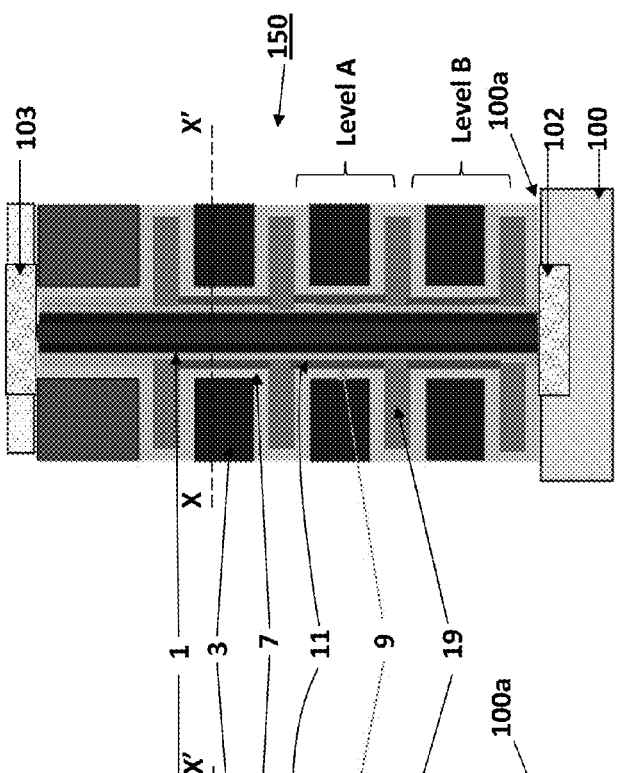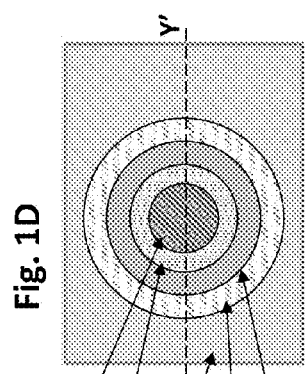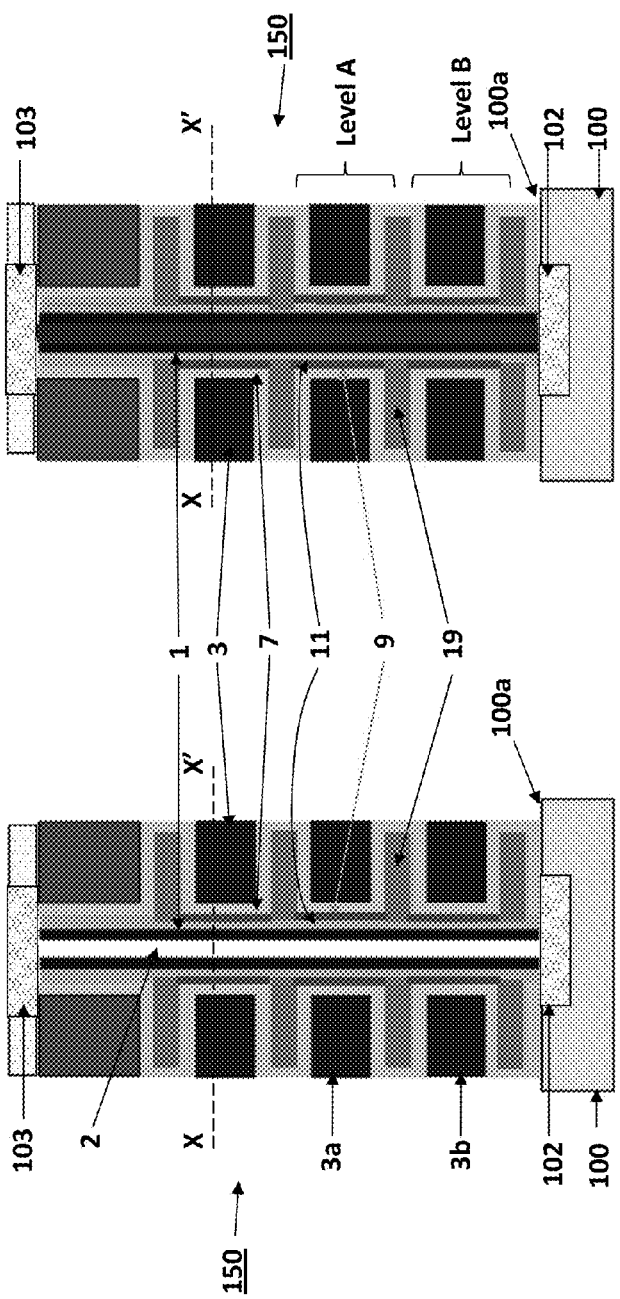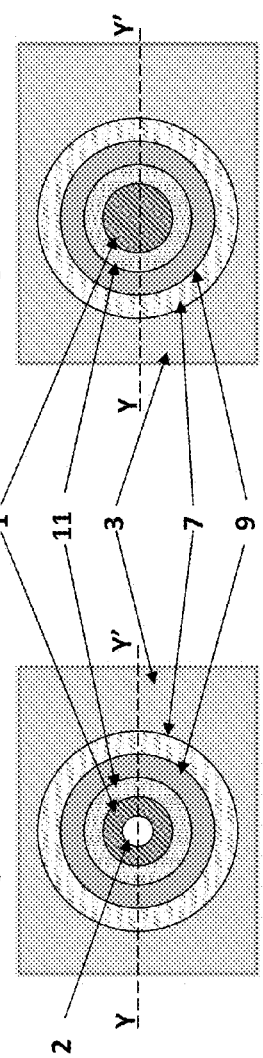

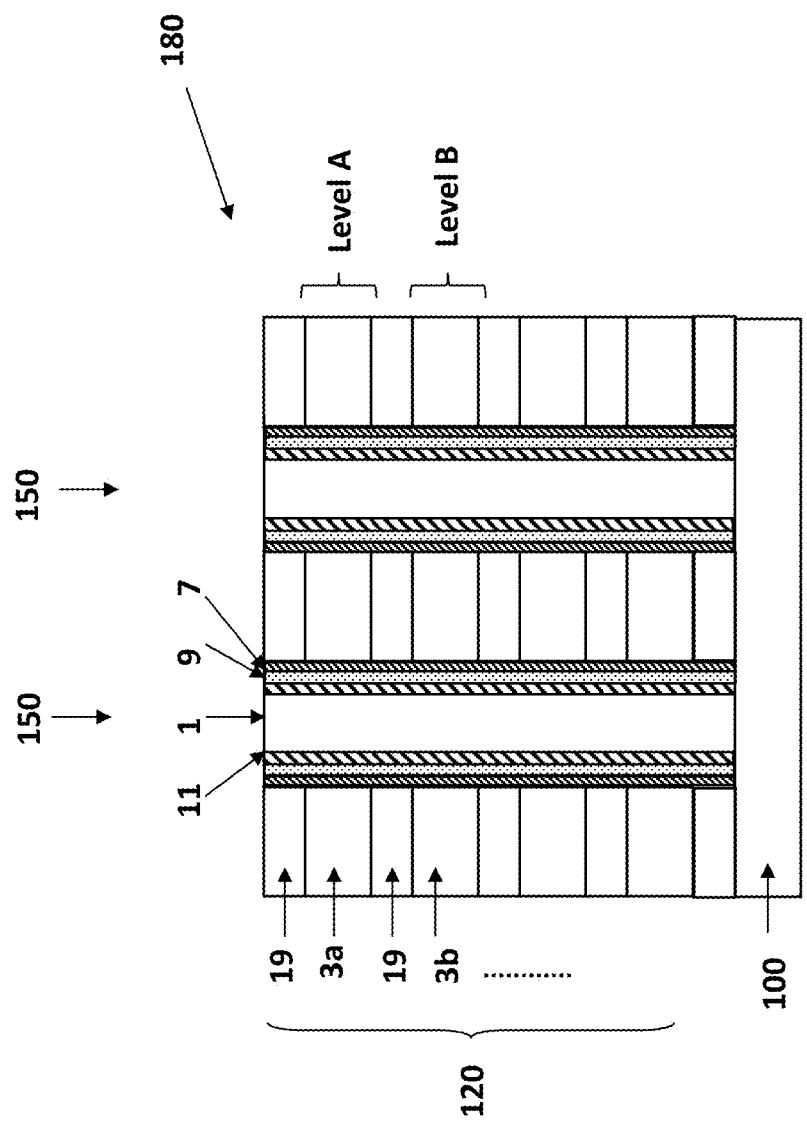

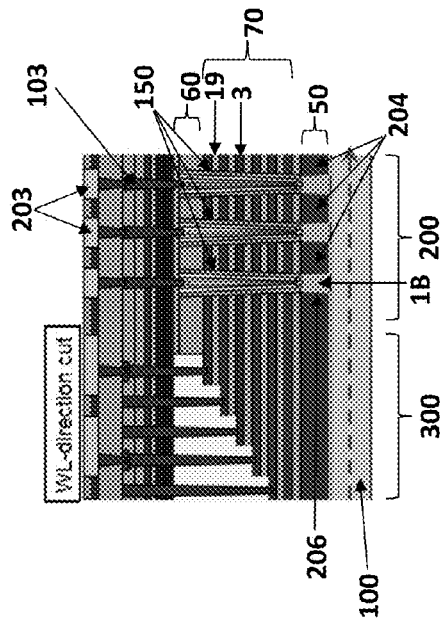
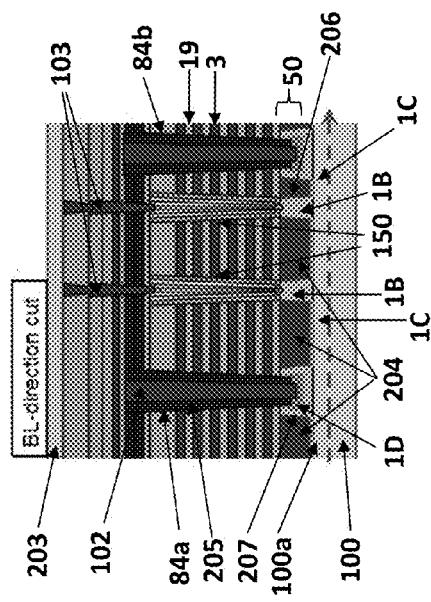
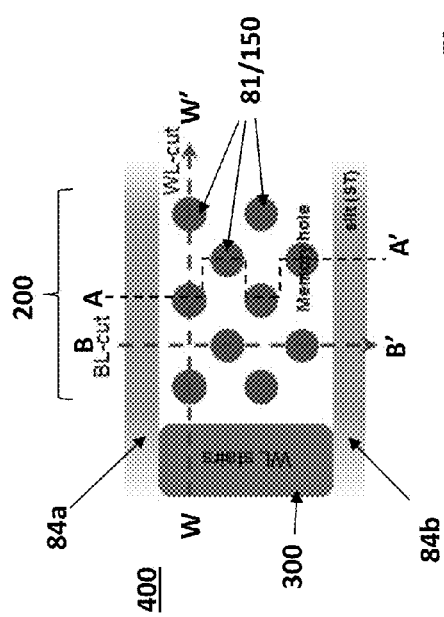

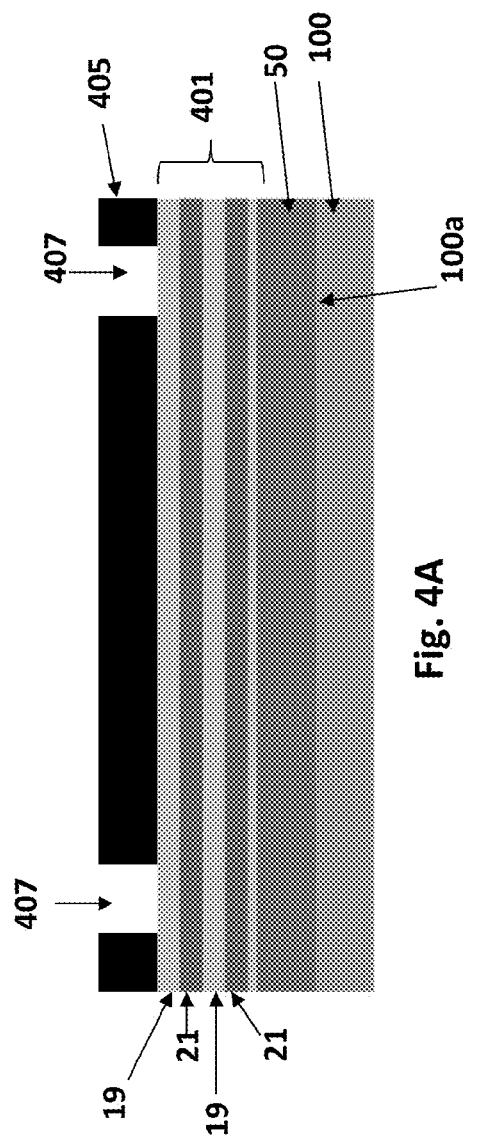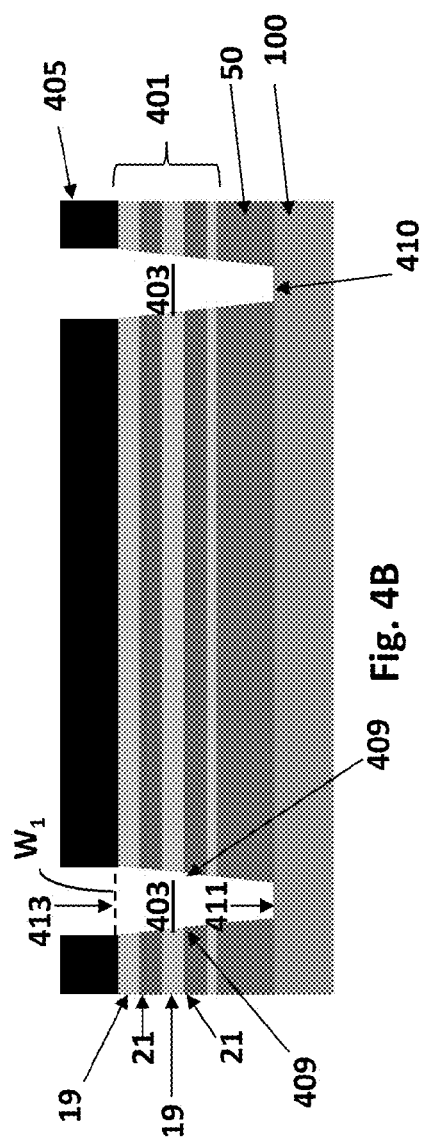

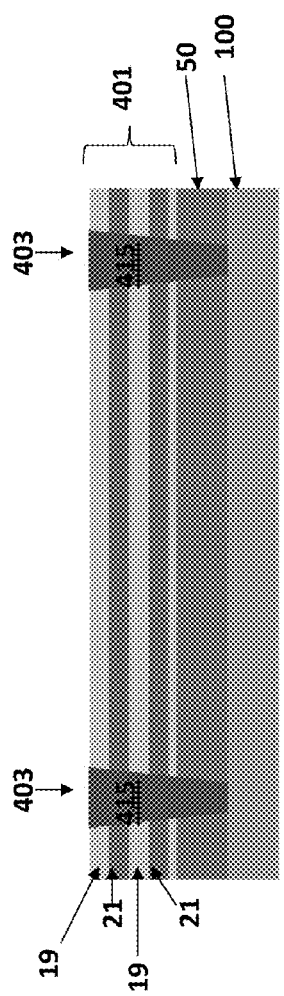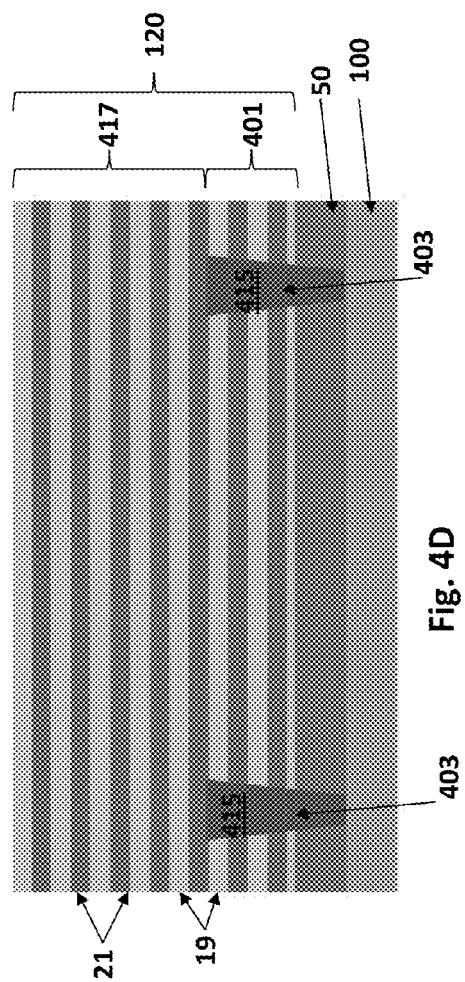

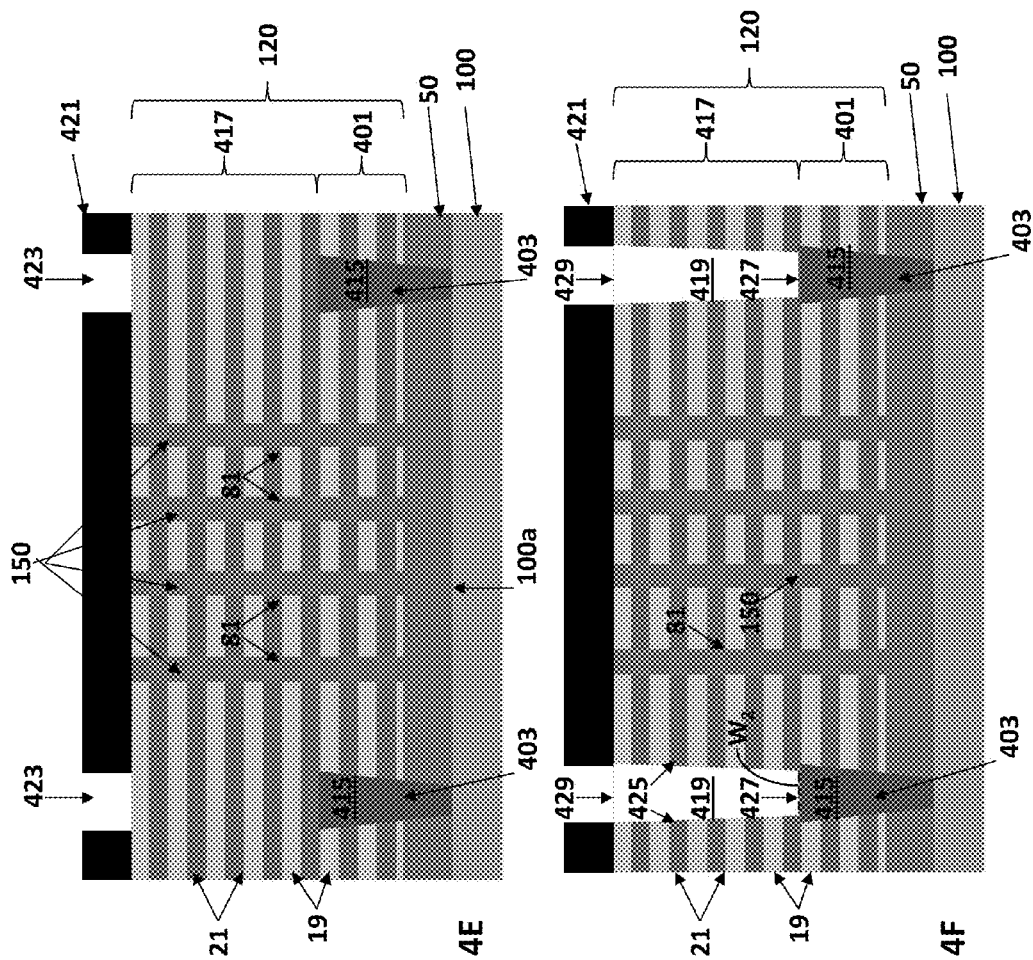

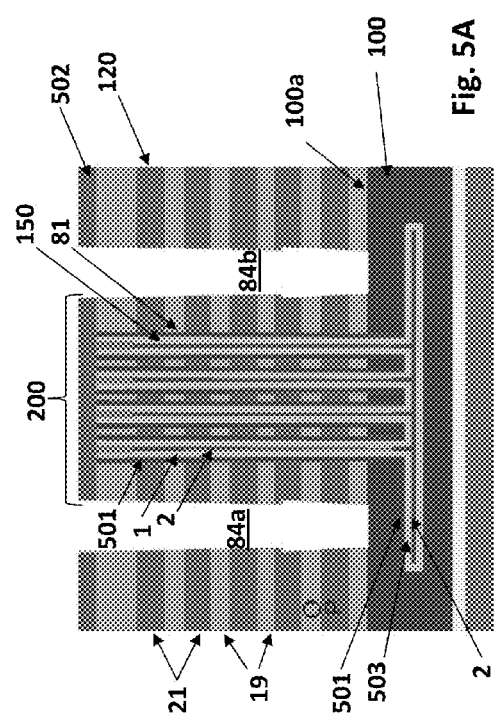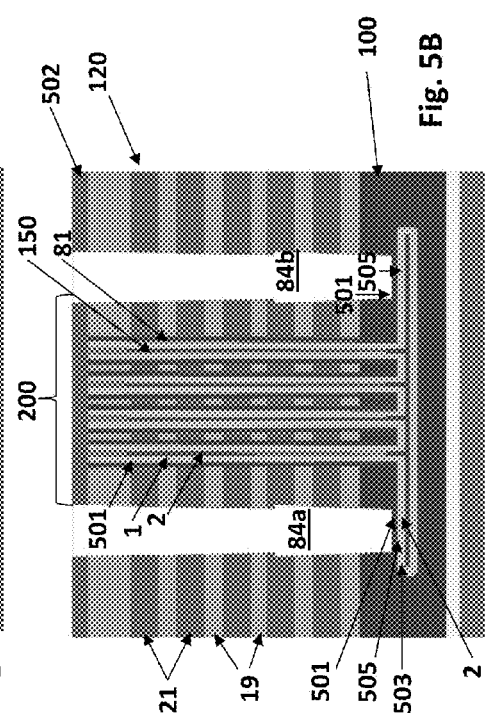

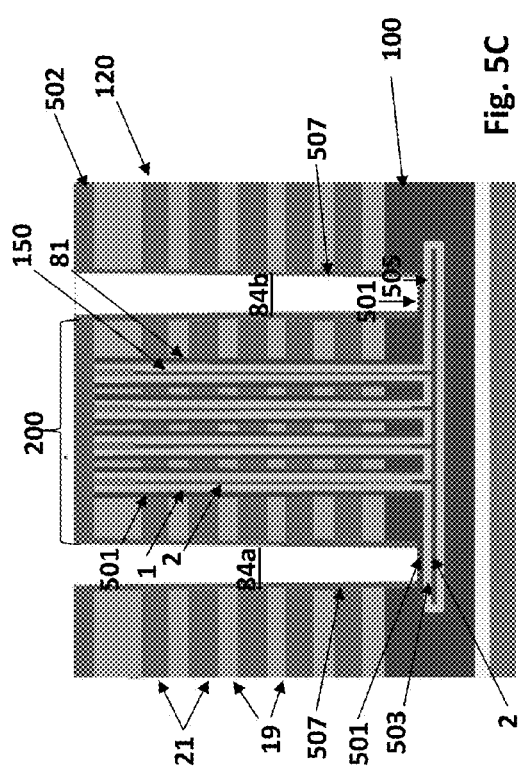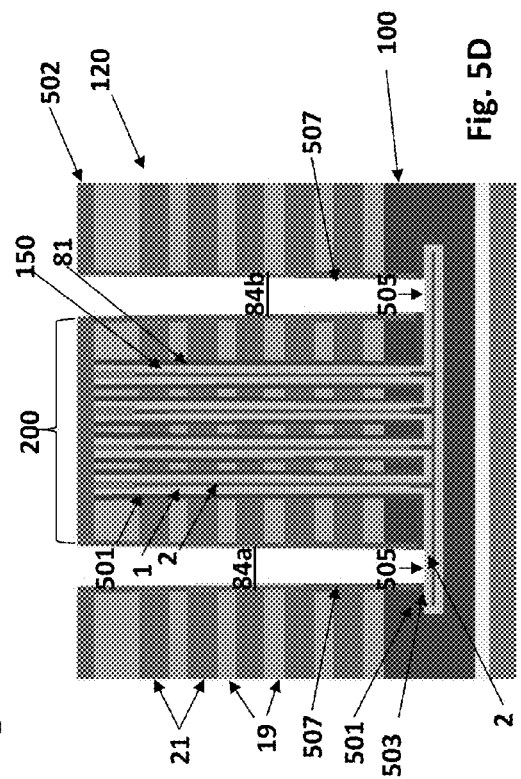

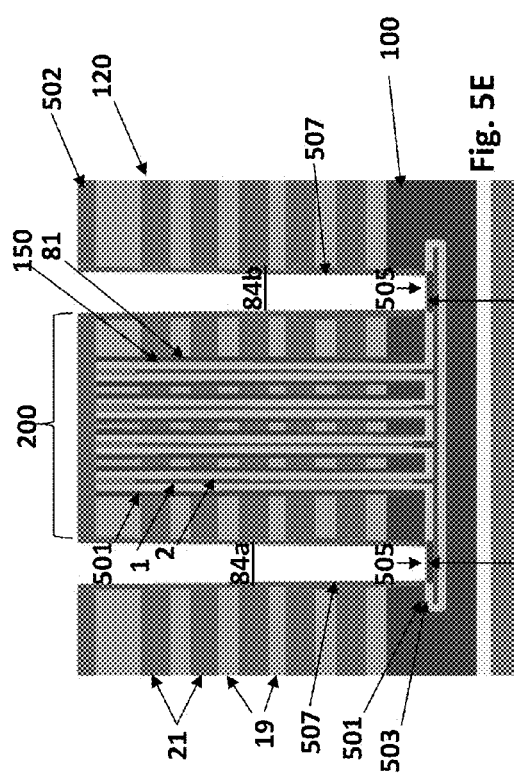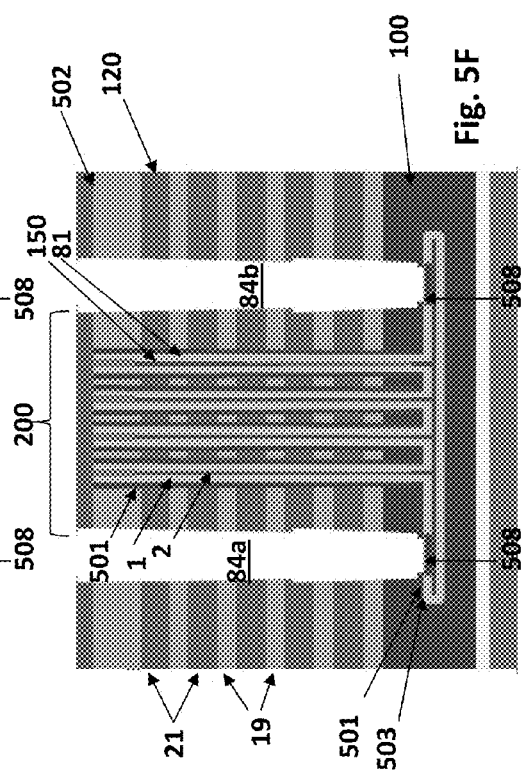

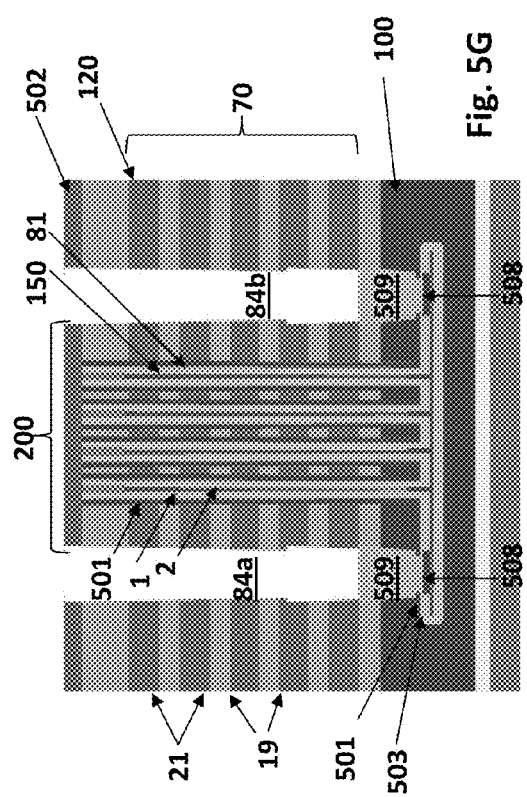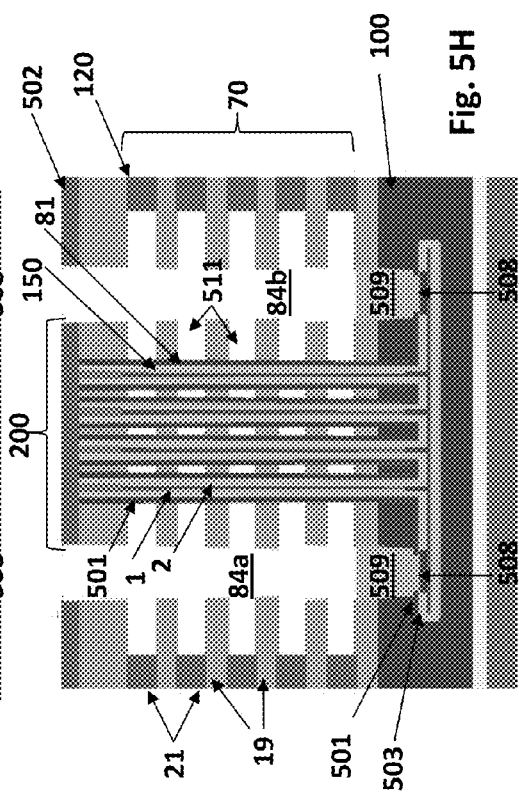

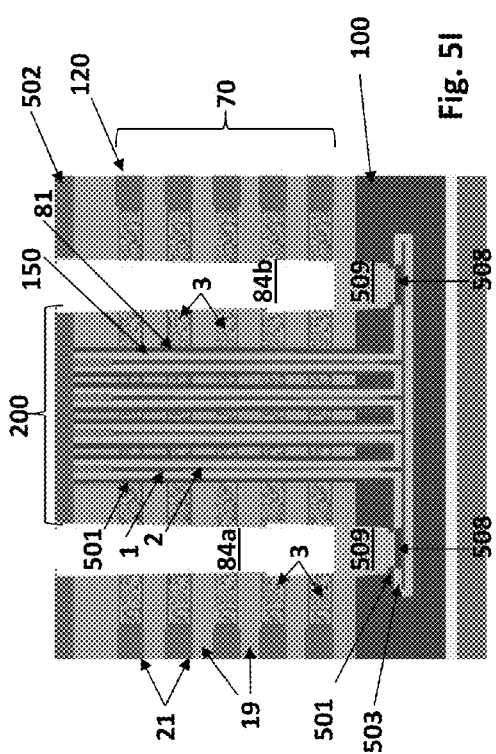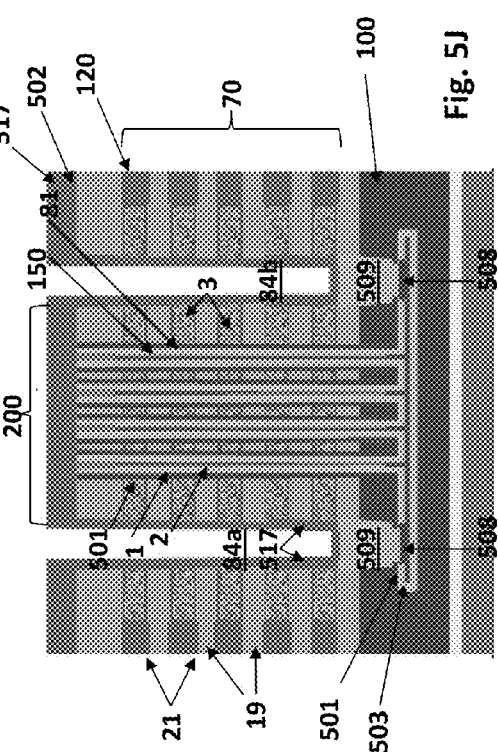

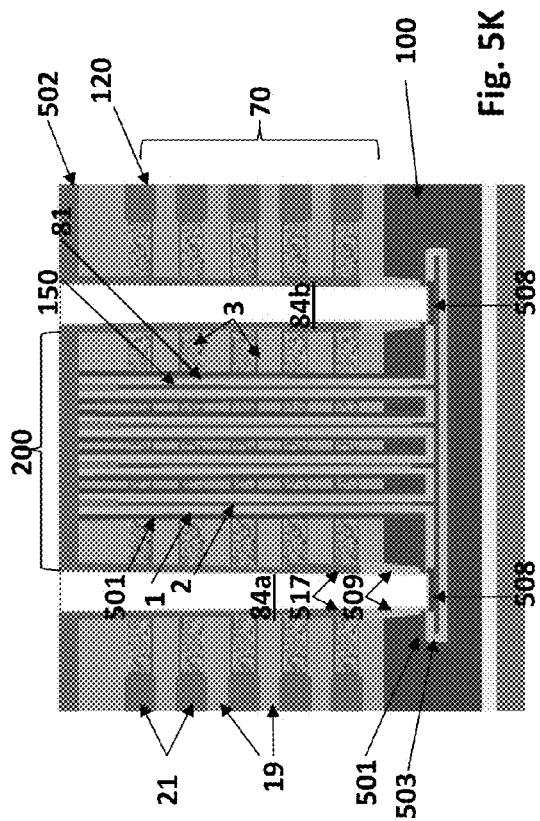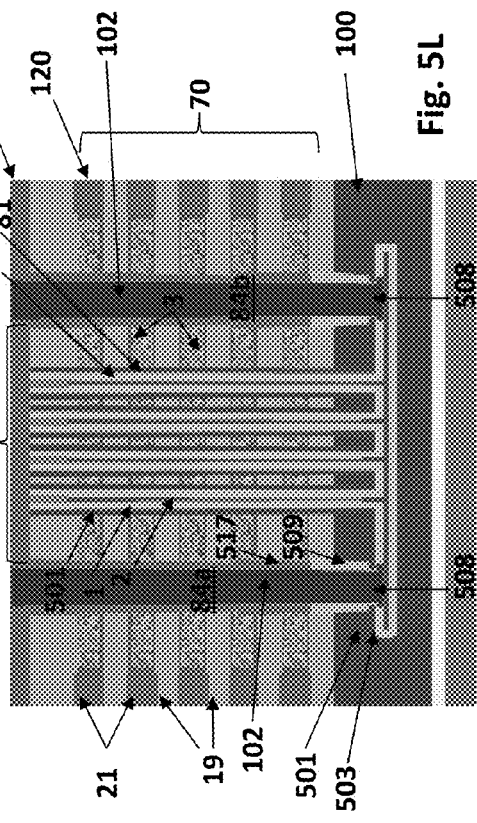

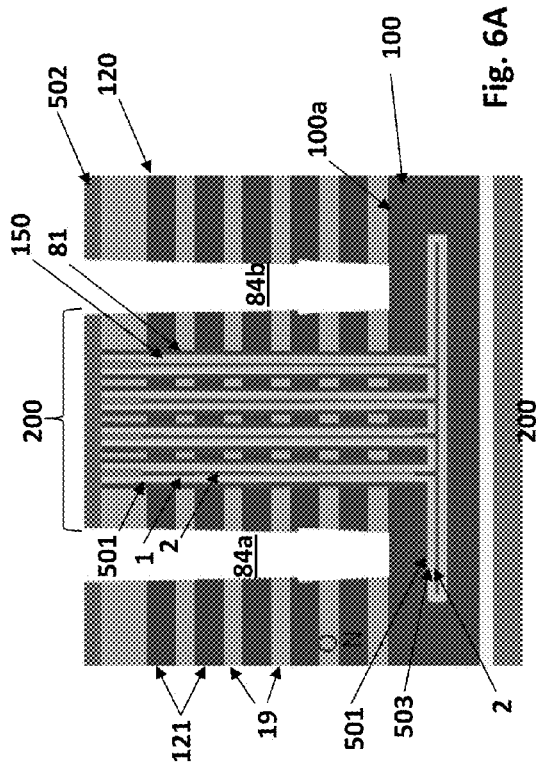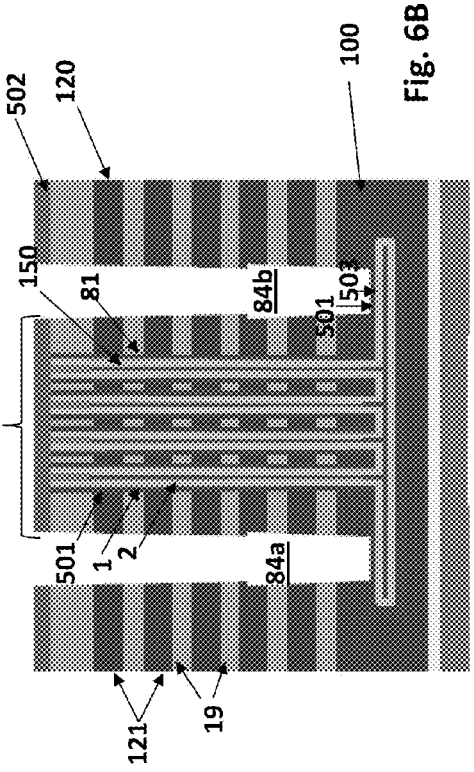

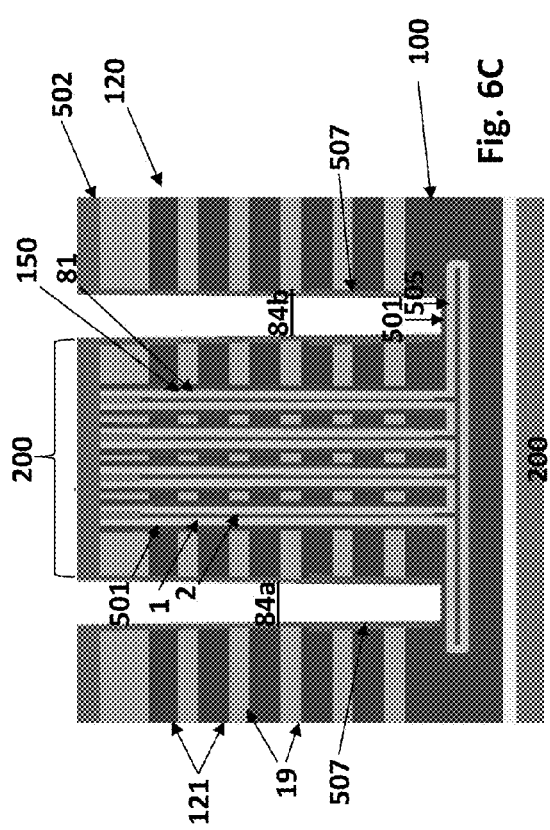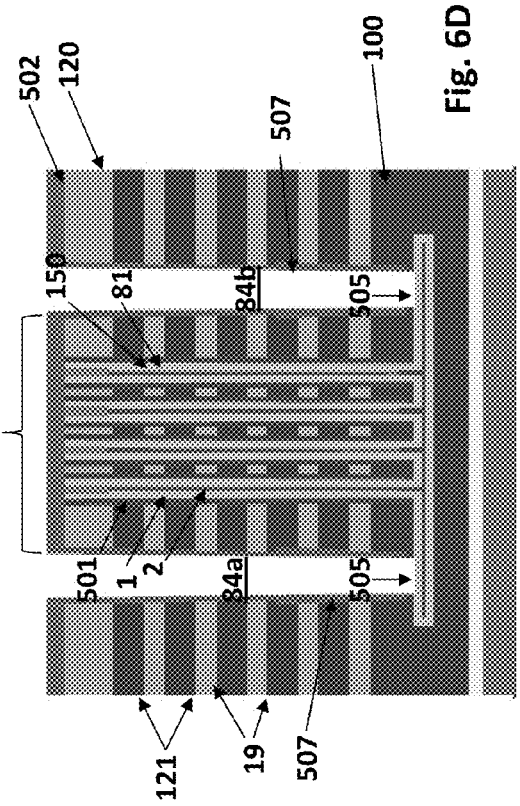

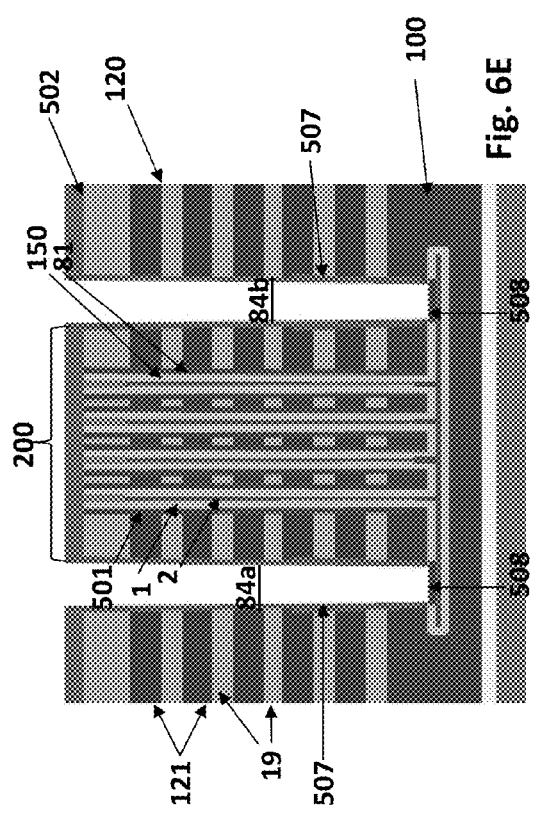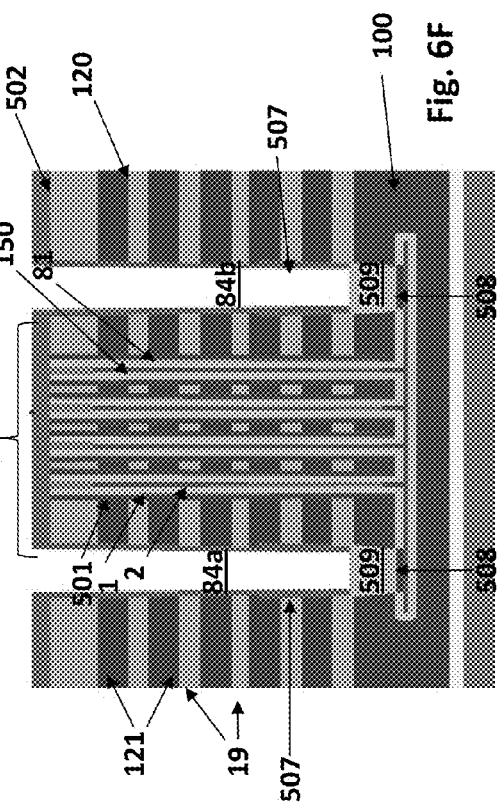

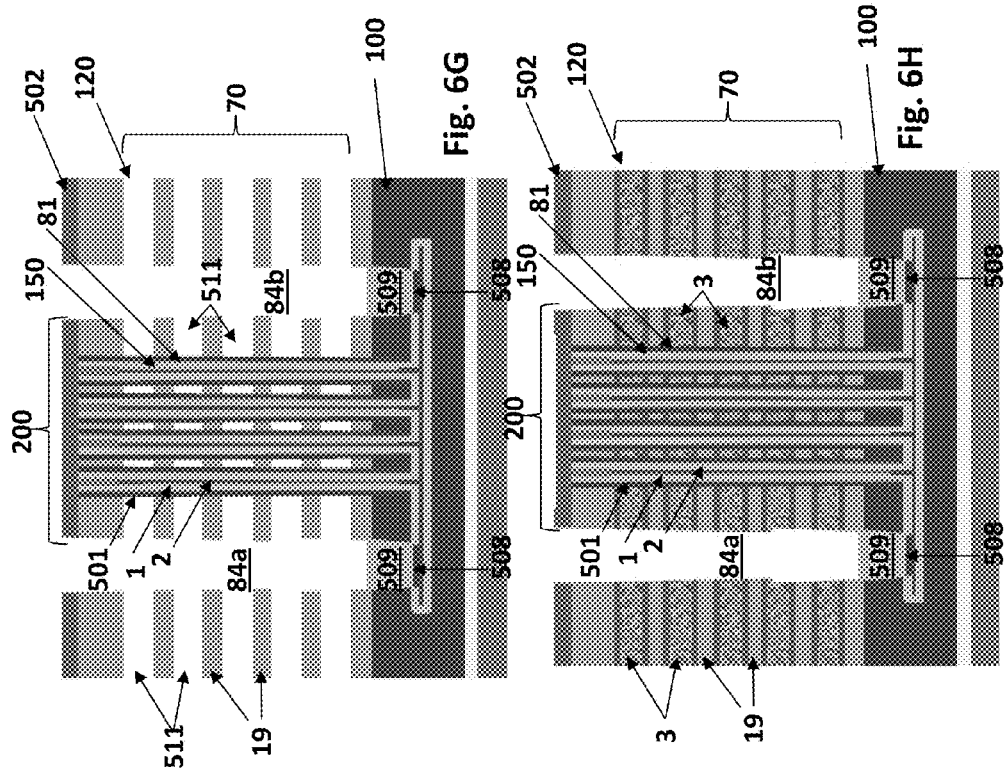

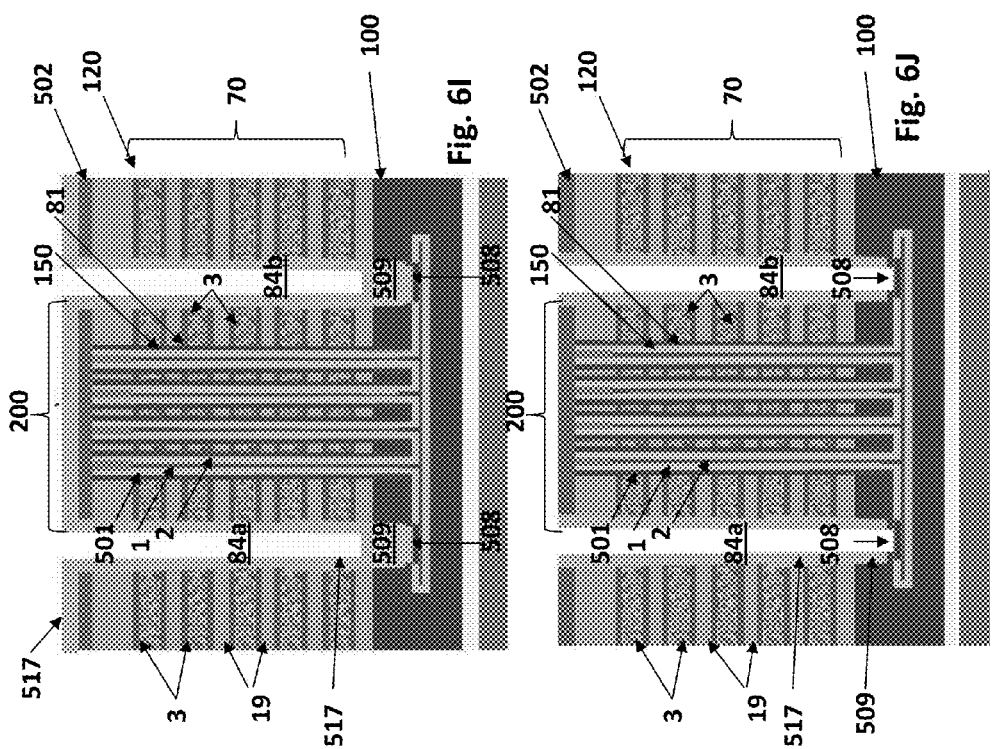

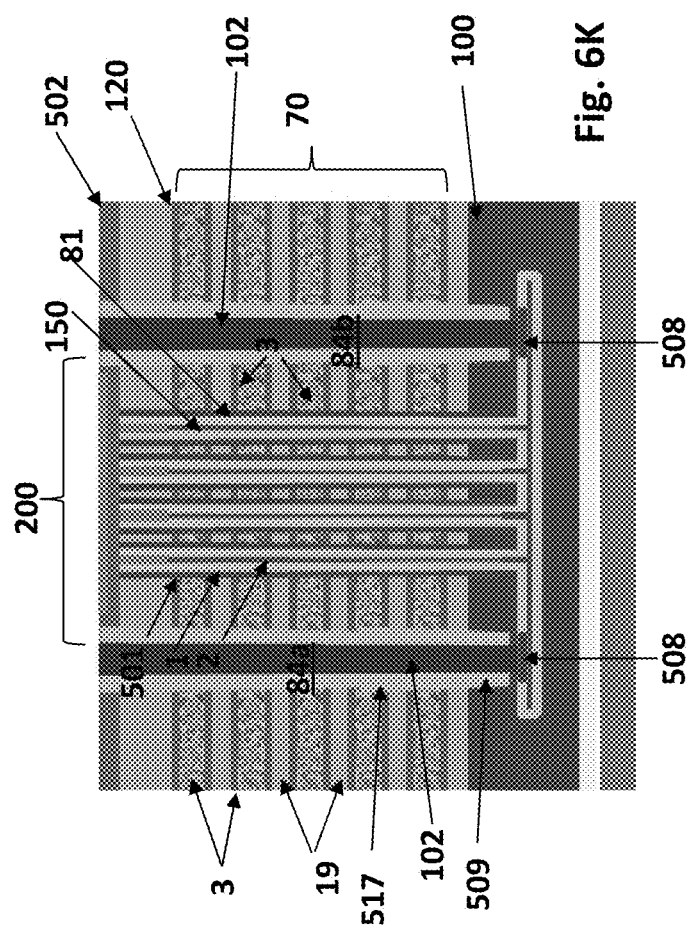

METHODS OF FABRICATING A THREE-DIMENSIONAL NON-VOLATILE MEMORY DEVICE

RELATED APPLICATION

This application claims the benefit of priority to U.S. Provisional Application No. 61/879,074, filed on Sep. 17, 2013, the entire contents of which are incorporated herein by reference.

FIELD

The present invention relates generally to the field of semiconductor devices and specifically to three dimensional non-volatile memory, such as vertical NAND strings, and other three dimensional devices and methods of making thereof.

BACKGROUND

Recently, ultra high density storage devices have been proposed using a three-dimensional (3D) stacked memory structure sometimes referred to as a Bit Cost Scalable (BiCS) architecture. For example, a 3D NAND stacked memory device can be formed from an array of alternating conductive and dielectric layers. A memory hole is formed through the layers to define many memory layers simultaneously. A NAND string is then formed by filling the memory hole with appropriate materials. A straight NAND string extends in one memory hole, while a pipe- or U-shaped NAND string (p-BiCS) includes a pair of vertical columns of memory cells. Control gates of the memory cells may be provided by the conductive layers.

SUMMARY

Embodiments relate to a method of fabricating a memory device that includes forming a first stack of alternating layers of a first material and a second material different from the first material over a substrate, removing a portion of the first stack to form a first trench, filling the trench with a sacrificial material, forming a second stack of alternating layers of the first material and the second material over the first stack and the sacrificial material, removing a portion of the second stack to the sacrificial material to form a second trench, and removing the sacrificial material to form a continuous trench through the first stack and the second stack.

BRIEF DESCRIPTION OF THE DRAWINGS

FIGS. 1A-1B are respectively side cross sectional and top cross sectional views of a NAND string of one embodiment. FIG. 1A is a side cross sectional view of the device along line Y-Y' in FIG. 1B, while FIG. 1B is a side cross sectional view of the device along line X-X' in FIG. 1A.

FIGS. 1C-1D are respectively side cross sectional and top cross sectional views of a NAND string of another embodiment. FIG. 1C is a side cross sectional view of the device along line Y-Y' in FIG. 1D, while FIG. 1D is a side cross sectional view of the device along line X-X' in FIG. 1C.

FIG. 2 is a partial side cross-sectional view of a memory device comprising a plurality of NAND strings formed in a stack of material layers over a substrate.

FIG. 3A is a top cross sectional view of a memory block comprising a plurality of NAND strings according to an embodiment.

FIGS. 3B and 3C are side cross sectional views of the memory block of FIG. 3A along the bit line and word line directions, respectively. FIG. 3B is a side cross sectional view of the device along line B-B' in FIG. 3A, while FIG. 3C is a side cross sectional view of the device along line W-W' in FIG. 3A.

FIGS. 4A-4G are partial side cross-sectional views of a stack of material layers over a substrate and illustrate a method of forming isolation trenches of a memory device according to an embodiment.

FIGS. 5A-5L are partial side cross-sectional views of a stack of material layers over a substrate and illustrate a method of forming conductive material control gate electrodes and source lines for a three-dimensional memory device according to an embodiment.

FIGS. 6A-6K are partial side cross-sectional views of a stack of material layers over a substrate and illustrate a method of forming conductive material control gate electrodes and source lines for a three-dimensional memory device according to another embodiment.

DETAILED DESCRIPTION

Figure 4G:
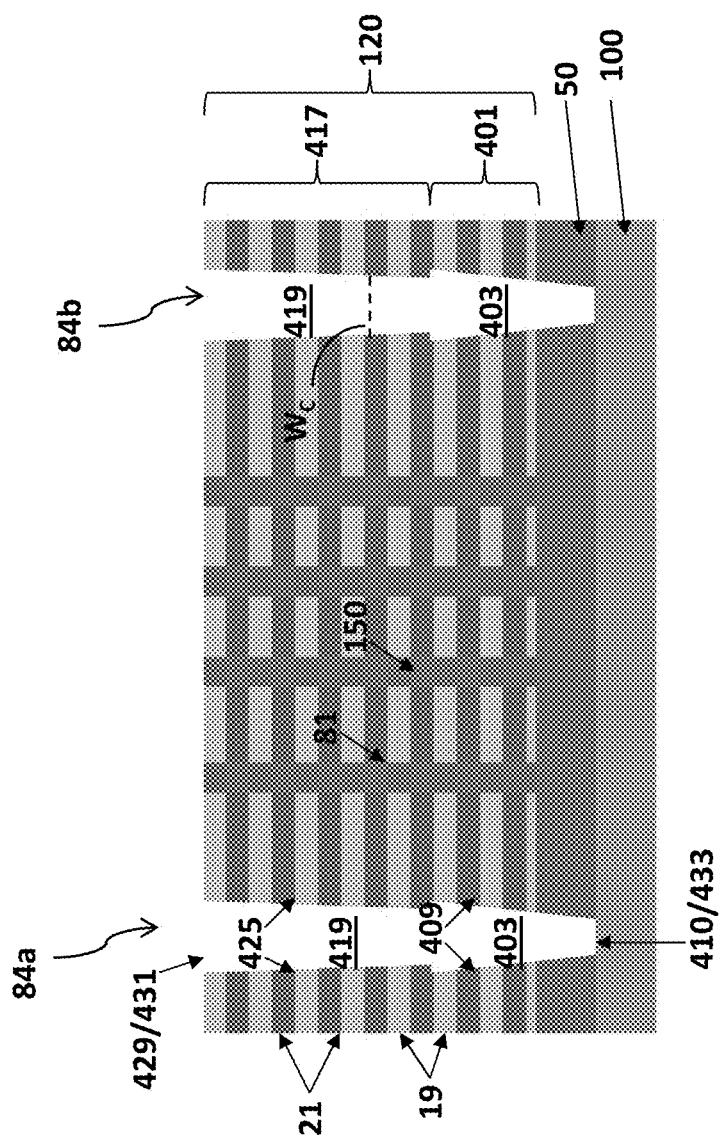

The embodiments of the invention provide a method for fabricating a semiconductor device, such as a three dimensional monolithic memory array comprising a plurality of NAND memory strings.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

In some embodiments, a monolithic three dimensional NAND string 150 comprises a semiconductor channel 1 having at least one end portion extending substantially perpendicular to a major surface 100a of a substrate 100, as shown in FIGS. 1A, 1C and 2. For example, the semiconductor channel 1 may have a pillar shape extending through a plurality of memory device levels (Level A, Level B, etc.) and the entire pillar-shaped semiconductor channel in the memory device levels extends substantially perpendicularly to the major surface 100a of the substrate 100, as shown in FIGS. 1A, 1C and 2. The channels 1 may be electrically connected to first and second (e.g., source and drain) electrodes 102, 103 which are schematically shown in FIGS. 1A and 1C. The first (e.g., source) electrode 102 may connect to the bottom of the channel 1 and the second (e.g., drain electrode 103) may connect to the top of the channel 1. The NAND string 150 may further include drain-side and source-side select or access transistors (not shown in FIGS. 1A-2 for clarity) which may be located above and below the memory levels of the NAND string 150, respectively.

In some embodiments, the semiconductor channel 1 may be a filled feature, as shown in FIGS. 1C and 1D. In some other embodiments, the semiconductor channel 1 may be hollow, for example a hollow cylinder filled with an insulating fill material 2, as shown in FIGS. 1A and 1B. In these embodiments, an insulating fill material 2 may be formed to fill the hollow part surrounded by the semiconductor channel 1.

A memory device 180 may comprise a plurality of NAND strings 150 formed in a stack 120 of material layers over the substrate 100, as shown in FIG. 2. The substrate 100 can be any semiconducting substrate known in the art, such as monocrystal line silicon, IV-IV compounds such as silicon-germanium or silicon-germanium-carbon, Ill-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND strings 150 further comprise a plurality of control gate electrodes 3 as shown in FIGS. 1A-2. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., memory device level A) and a second control gate electrode 3b located in a second device level (e.g., memory device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride, alloys thereof or combination of these materials. For example, the control gate material in FIGS. 1A-1D may comprise a conductive metal or metal alloy, such as tungsten, titanium nitride, and/or tungsten nitride, while the control gate material in FIG. 2 may comprise doped polysilicon.

A blocking dielectric 7 is located adjacent to the control gate(s) 3 and may surround the control gate 3, as shown in FIGS. 1A and 1C. Alternatively, a straight blocking dielectric layer 7 may be located only adjacent to an edge (i.e., minor surface) of each control gate 3, as shown in FIG. 2. The blocking dielectric 7 may comprise one or more layers having plurality of blocking dielectric segments located in contact with a respective one of the plurality of control gate electrodes 3. Alternatively, the blocking dielectric 7 may comprise one or more continuous layers which extend the entire length of the memory cell portion of the NAND string 150, as shown in FIG. 2.

The monolithic three dimensional NAND string also comprise a charge storage region 9. The charge storage region 9 may comprise one or more continuous layers which extend the entire length of the memory cell portion of the NAND string as shown in FIG. 2. For example, the charge storage region 9 may comprise an insulating charge trapping material, such as a silicon nitride layer. Alternatively, the charge storage region may comprise a plurality of discrete charge storage regions or segments 9 located between the blocking dielectric 7 and the channel I, as shown in FIGS. 1A and 1C. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments. Alternatively, the charge storage region 9 may comprise conductive nanoparticles, such as metal nanoparticles, for example ruthenium nanoparticles.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

In various embodiments, the three-dimensional NAND string 150 may have a generally pillar shape that extends substantially perpendicular to the major surface of the substrate 100, with a first (e.g., drain) electrode 103 that connects to the NAND string 150 at the top of the NAND string 150 (i.e., distal to the substrate 100) and a second (e.g., source) electrode 102 that connects to the NAND string 150 at the bottom of the NAND string 150 (i.e., proximate to the substrate 100). In embodiments, each NAND string 150 may have a first select or access transistor (e.g., a drain-side select gate transistor) located above the memory levels of the NAND string 150, and a second select or access transistor (e.g., a source-side select gate transistor) located below the memory levels of the NAND string 150.

In embodiments, the generally vertically-extending semiconductor channel 1 of each NAND string 150 (i.e. first semiconductor channel portion) may be electrically coupled to a second semiconductor channel portion located over or within the substrate 100 and extending in a generally horizontal direction (i.e., parallel to the major surface 100a of the substrate 100). One or more trenches may be formed through the stack 120 proximate to the NAND strings 150, and electrically conductive source line(s) may be formed within the trench(es) and in electrical contact with the generally horizontally-extending second portions of the semiconductor channels.

FIGS. 3A-3C illustrate a memory block 400 containing an array of a plurality of vertical NAND strings 150 according to one embodiment of the invention. Each string includes the lower 50 (e.g., source) and upper 60 (e.g., drain) select gate device levels located below and above the memory device levels 70, respectively, as shown in FIG. 3C. In this embodiment, the memory block 400 comprises an active memory cell area 200 containing the array of vertical NAND strings 150. The active memory cell area 200 is bordered on one side by a first isolation trench (i.e., slit trench) 84a and on the opposite side by a second isolation trench (i.e., slit trench) 84b. On the left side of the active memory cell area 200 in FIG. 3A is a stepped word line contact region 300.

FIG. 3A is a top cross sectional view of a memory block of an embodiment of the invention. FIGS. 3B and 3C are side cross sectional views of the memory block of FIG. 3A along the bit line and word line directions, respectively. FIG. 3B is a side cross sectional view of the device along line B-B' in FIG. 3A, while FIG. 3C is a side cross sectional view of the device along line W-W' in FIG. 3A.

As shown in FIGS. 3B and 3C, the lower (e.g., source) select gate device level 50 includes a select gate electrode 204 over the substrate 100 that extends generally parallel to the major surface 100a of the substrate 100. A plurality of protrusions 1B comprising a semiconductor channel material extend in a generally vertical direction from the major surface 100a of the substrate such that the select gate electrode 204 is adjacent to at least two opposing side surfaces of each protrusion 1B. A gate insulating layer 206 extends generally parallel to the major surface of the substrate 100a between the select gate electrode 204 and the substrate 100 and also extends generally perpendicular to the major surface 100a of the substrate 100 between the select gate electrode 204 and the side surfaces of the protrusions 1B. Each NAND string 150 is located above a protrusion 1B (i.e., optional third semiconductor channel portion), such that the generally vertically-extending channel 1 (i.e., first semiconductor channel portion) of each NAND string 150 electrically contacts the top surface of a protrusion 1B.

The select gate electrode 204 may comprise any suitable electrically conductive material, such as heavily doped semiconductor (e.g., heavily doped polysilicon), a metal or metal alloy. The select gate electrode 204 preferably comprises a metal or metal alloy, such as tungsten, copper, aluminum, tantalum, titanium, cobalt, titanium nitride, alloys thereof or combination of these materials. In one non-limiting embodiment, the select gate electrode 204 comprises a titanium nitride liner peripheral portion contacting the gate insulating layer 206, and a tungsten central portion contacting the titanium nitride liner peripheral portion. The gate insulating layer 206 may comprise a suitable insulating material, such as silicon oxide. The protrusion 1B may comprise a suitable semiconductor material, such as an epitaxially-grown single crystal semiconductor material (e.g., silicon) and/or a polycrystalline semiconductor (e.g., silicon) material that is recrystallized by thermal treatment or laser annealing to form single crystal or large grain polycrystalline semiconductor material.

Various fabrication methods and select gate device level 50 configurations may be used. For example, a lower select gate device level 50 may be fabricated as described in U.S. patent application Ser. No. 14/133,979, filed on Dec. 19, 2013, U.S. patent application Ser. No. 14/225,116, filed on Mar. 25, 2014, U.S. patent application Ser. No. 14/225,176, filed on Mar. 25, 2014, and/or U.S. Provisional Application No. 61/977,193, filed on Apr. 9, 2014, all of which are incorporated by reference herein for all purposes.

As is shown in FIG. 3B, additional (e.g., second) semiconductor channel portions 1C may be located over or in the substrate 100 and may extend in a direction that is generally parallel to the major surface 100a of the substrate 100 (i.e., in a generally horizontal direction in FIG. 3B). The additional semiconductor channel portions 1C may electrically couple the semiconductor channel portions of the protrusions 1B to a conductive source line 102 located in an isolation trench 84a, 84b. In the embodiment of FIG. 3B, the generally horizontally-extending channel protrusions 1C are electrically connected to an additional (i.e., fourth) channel portion 1D that extends in a generally vertical direction within a pillar- or rail-shaped protrusion 207 that extends in a generally perpendicular direction from the major surface 100a of the substrate 100, and the source line 102 is electrically coupled to the channel portion 1D at the top surface of the protrusion 207. In other embodiments, the protrusion 207 may be omitted, and the source line 102 may directly contact the generally horizontally-extending channel portion 1C (i.e., second semiconductor channel portion). Thus, the source lines 102 may be electrically connected to the bottom portions of the semiconductor channels 1 (i.e., first semiconductor channel portions) in the NAND strings 150 via the second, third and optionally fourth semiconductor channel portions 1C, 1B and 1D.

The upper select gate device level 60 contains the drain side select gate transistor (not shown for clarity) located over the NAND memory cell region in memory device levels 70. As discussed above, each NAND string 150 contains a NAND memory cell region in the memory device levels 70 which includes the semiconductor channel 1 which extends perpendicular to the major surface 100a of the substrate 100. A bottom portion of the semiconductor channel 1 contacts the protrusion 1B in the lower (i.e., source-side) select gate device level 50.

As illustrated in FIG. 3C, each NAND string 150 contains a plurality of control gate electrodes 3 which extend substantially parallel to the major surface 100a of the substrate 100 in the memory device levels 70 from the memory region 200 to the stepped word line contact region 300. The portions of the control gate electrodes 3 which extend into region 300 may be referred to as "word lines" herein. The drain line 203 electrically contacts an upper portion of the semiconductor channel 1 via drain electrodes 103.

Furthermore, each NAND string 150 contains at least one memory film which is located adjacent to the semiconductor channel 1 in the memory device levels 70. Specifically, the memory film is located between the semiconductor channel 1 and the plurality of control gate electrodes 3. The memory film contains the tunnel dielectric 11, the charge storage region(s) 9 (e.g., a charge trapping layer or floating gates), and the blocking dielectric 7, as described above in connection with FIGS. 1A-2.

FIG. 3A illustrates a top view of a memory block 400. The memory block includes an array of NAND strings including at least one row of monolithic three dimensional NAND strings 150 described above, a first dielectric filled trench 84a located on a first side of the array, and a second dielectric filled trench 84a located on a second side of the array opposite to the first side of the array.

The array of NAND strings may include any number of rows of NAND strings 150. For example, the array shown in FIG. 3A comprises at least a 4×4 array of NAND strings. In other words, the array shown in these figures has four rows of NAND strings, and there are at least four NAND strings in each row. The rows of NAND strings extend in the word line direction (e.g., along line W-W' in FIG. 3A). Thus, the array in the block 400 comprises first, second, third and fourth rows of NAND strings 150 extending in the word line direction. As shown in FIG. 3A, the semiconductor channels in the first and the third rows of NAND strings are preferably offset from respective semiconductor channels in the second and fourth rows of NAND strings along the word line direction. In general, the semiconductor channels in the odd numbered rows of NAND strings may be offset from respective semiconductor channels in the even numbered rows of NAND strings along the word line direction. In one embodiment, the semiconductor channels in the first and second rows of NAND strings 150 extending in the word line direction (i.e., the top two rows in FIG. 3A) may be electrically connected to the conductive source line 102 in trench 84a via semiconductor channels 1C extending parallel to the major surface 100a of the substrate 100 (see FIG. 3B), and the semiconductor channels in the third and forth rows of NAND strings 150 extending in the word line direction (i.e., the bottom two rows in FIG. 3A) may be electrically connected to the conductive source line 102 in trench 84b via semiconductor channels 1C extending parallel to the major surface 100a of the semiconductor substrate 100.

In alternative embodiments, each memory block 400 may have an array with less than 4 rows of NAND strings, such as only one row of NAND strings or two rows of NAND strings. Alternatively, the array in each block may have more than 4 rows, such as 5 to 20 rows of NAND strings, where each row may contain 4 to 100 NAND strings.

As shown in FIG. 3B, the control gate electrodes 3 extend in the word line direction W-W' which is perpendicular to the bit line direction B-B'. The control gate electrodes 3 are continuous in the array in the memory block 400. In other words, the control gate electrodes 3 have a shape of a continuous strip or sheet with discrete openings 81 (which are referred to herein as front side openings or memory holes) which contain the NAND strings 150. However, the control gate electrodes 3 have electrical and physical continuity in the bit line direction between the trenches 84 and in the word line direction throughout the block 400. In other words, the memory holes 81 do not completely sever the continuous electrical and physical path in the control gate electrodes from one trench 84a to the opposite trench 84b in each block.

Likewise, the select gate electrode 204 also extends in the word line direction W-W' which is perpendicular to the bit line direction B-B'. The select gate electrode 204 is also continuous in the array in the memory block 400. In other words, the select gate electrode 204 has a shape of a continuous strip or sheet with electrically insulated protrusions 1B extending through the electrode 204. However, the select gate electrode 204 has electrical and physical continuity in the bit line direction between the gate insulating layer 206 under trenches 84a, 84b and in the word line direction throughout the block 400. In other words, the protrusions 1B do not completely sever the continuous electrical and physical path in the select gate electrode from gate insulating layer 206 adjacent to one trench 84a to the gate insulating layer 206 adjacent to the opposite trench 84b in each block 400.

Thus, the memory block 400 contains a common control gate electrode 3 in each of the plurality of memory device levels 70 for the first, second, third and fourth rows of NAND strings shown in FIG. 3A. Likewise, the source side select gate electrode 204 comprises a common source side select gate electrode for the first, second, third and fourth rows of NAND strings in the block 400. Therefore, all of the NAND strings in the array in each block 400 can be erased together in the same erase step. In addition, one specific memory cell can be selected by selecting (i.e., applying a current or voltage) to one select gate 204, one bit line (i.e., drain line) 203 and one word line (e.g., control gate electrode) 3. Specifically, a particular block 400 may be selected with the common select gate 204 in that block, the specific memory hole 81/NAND string 150 may be selected with the bit line 203, and the particular cell in one memory device level 70 in the NAND string 150 may be selected with the word line 3.

A first source line 102 is located in the first dielectric filled trench 84a and a second source line 102 is located in the second dielectric filled trench 84b in each block 400, as shown in FIGS. 3A and 3B. In the memory device levels 70, the dielectric fill in the trench 84 may comprise any suitable insulating layer 205, such as silicon oxide, etc., which is located on both walls of the trench 84. The source line 102 is located in the middle of the trench 84 and is separated from the control gate electrodes 3 and from the select gate electrode 204 by the insulating layer 205.

The trenches 84a, 84b are typically formed by etching the stack 120 through a mask to expose a semiconductor channel portion (i.e., channel portion 1D in FIG. 3B, or channel portion 1B if portion 1D is omitted), forming the insulating layer 205 over the sidewalls of the trenches 84a, 84b and forming the source lines 102 within the trenches 84a, 84b such that the source lines 102 electrically contact the exposed semiconductor channel portion (e.g., a doped source region in semiconductor channel portion 1B or 1D). In order to minimize feature spacing and improve process margins, it is advantageous to form the trenches using a high aspect ratio etching process. However, it is difficult to maintain proper alignment of the trench 84 using a high aspect ratio etching process.

Various embodiments include methods of making a memory device such as a monolithic three-dimensional NAND string memory device. FIGS. 4A-4G illustrate a method of making a memory device according to a first, non-limiting embodiment of the invention. In embodiments, the method of FIGS. 4A-4G may reduce misalignment of high aspect ratio isolation trenches and improve process margins.

As shown in FIG. 4A, a plurality of alternating layers 19, 21 of a first material and a second material different than the first material are deposited over the major surface 100a of the substrate 100 to form a first stack 401. The layers 19, 21 may be deposited directly on the major surface 100a of the substrate 100, or may be deposited over another layer or layer(s) that is formed on the substrate 100. For example, a lower (e.g., source) select gate device level 50 may be formed over or within the substrate 100 as described above, and the first stack 401 of alternating layers 19, 21 may be formed over the lower select gate device level 50 as shown in FIG. 4A.

The layers 19, 21 of the first stack 401 may be deposited by any suitable deposition method, such as sputtering, CVD, PECVD, MBE, ALD, etc. The layers 19, 21 may be 6 to 100 nm thick. In this embodiment, the first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material). The second layers 21 may comprise a semiconductor material (e.g., silicon, such as polysilicon). In one embodiment, layers 19 comprise silicon oxide and layers 21 comprise polysilicon.

The deposition of layers 19, 21 is followed by etching the first stack 401 to form at least one first trench 403. The first trench(es) 403 may be formed in the locations of the future isolation trenches 84 that will define the active memory cells areas as described above. The first trenches 403 may be formed by photolithography and etching, as follows. First, a mask 405 is formed over the first stack 401 and patterned to form openings 407 exposing the stack 401, as shown in FIG. 4A. Mask 405 may comprise any suitable material, such as one or more layer of photoresist and/or hard mask material (e.g., photoresist over silicon nitride and amorphous carbon layers). Then, the first stack 401 may be etched (e.g., using reactive ion etching (RIE)) to form the first trenches 403 in the stack through the openings 407 in mask 405, as shown in FIG. 4B. The first trench 403 may preferably extend through the alternating layers 19, 21 of the first stack 400, and may optionally extend through a lower select gate device layer 50 to the substrate 100, as shown in FIG. 4B. The mask 405 may then be removed.

The first trenches 403 may each comprise a pair of first trench sidewalls 409 extending from a first end 411 of the trench 403 (i.e., the bottom 410 of the trench 403) proximate to the substrate 100 to a second end 413 distal to the substrate 100. The distance between the sidewalls 409 defines a width of the trench 403, and the width of the trench 403 may decrease between the second end 413 and the first end 411 of the trench 403 as shown in FIG. 4B. The first trench 403 may have a width, $W_1$, at the second end 413 of the trench 403 (i.e., distal to the substrate 100).

The first trenches 403 may be filled with a sacrificial material 415, as shown in FIG. 4C. The sacrificial material 415 may comprise a dielectric material, such as silicon nitride or silicon oxide. Alternatively or in addition, the sacrificial material 415 may comprise a carbon material (e.g., undoped carbon, doped carbon, amorphous carbon and/or polycrystalline carbon) and/or a semiconductor material, such as undoped polysilicon. The sacrificial material 415 may be planarized, such as by chemical mechanical polishing (CMP) or an etch-back process, to make the sacrificial material 415 planar with the top surface of the first stack 401, as shown in FIG. 4C.

A second stack 417 of alternating layers 19, 21 of the first material and the second material may be formed over the first stack 401 and the sacrificial material 415, as shown in FIG. 4D. The alternating layers 19, 21 of the second stack 417 may be the same as the layers 19, 21 in the first stack 401 such that the first and second stacks 401, 417 form a continuous stack 120 of alternating material layers 19, 21 over the substrate 100.

A plurality of NAND memory strings 150 may be formed in the continuous stack 120 by forming a plurality of front side openings/memory holes 81 extending through the continuous stack 120 in a direction that is substantially perpendicular to the major surface 100a of the substrate 100, forming at least one memory film (e.g., a tunnel dielectric layer 7, a charge trap/floating gate layer 9 and/or a blocking dielectric layer 11 as shown in FIGS. 1A-2) within each front side opening/memory hole 81, and forming a semiconductor channel 1 within each front side opening/memory hole 81. FIG. 4E schematically illustrates four NAND memory strings 150 formed in memory holes 81 that are located between the first trenches 403. Each of the NAND memory strings 150 may be substantially as described above in connection with FIGS. 1A-3C. The NAND memory strings 150 may have an offset configuration such as shown in FIG. 3A in which semiconductor channels in the first and the third rows of NAND strings are preferably offset from respective semiconductor channels in the second and fourth rows of NAND strings along the word line direction. Thus, the NAND memory strings 150 shown in FIG. 4E may be taken along line A-A' in FIG. 3A.

The NAND memory strings 150 in FIG. 4E may lack conductive control gate electrodes 3, which may be formed in a subsequent control gate replacement process, as described further below. Various methods for forming NAND memory strings 150 in a stack 120 of alternating material layers are described in the previously-mentioned U.S. patent application Ser. Nos. 14/133,979, 14/225,116, 14/225,176 and 61/977,193, which are incorporated by reference herein for all purposes.

The stack 120 may be etched to form at least one second trench 419. The second trenches 419 may be formed in the locations of the future isolation trenches 84 that will define the active memory cell areas as described above. Thus, the second trenches 419 may be formed above and substantially aligned with the first trenches 403 that are filled with sacrificial material 415. In FIGS. 4E-4G, the second trenches 419 are formed following the formation of the NAND strings 150 in the stack 120. In other embodiments, the second trenches 419 may be formed before the memory holes 81 and NAND strings 150 are formed.

The second trenches 419 may be formed by photolithography and etching, as follows. First, a mask 421 (e.g., photoresist and/or hard mask material) may formed over the continuous stack 120 and patterned to form openings 423 exposing the top surface of the stack 120, as shown in FIG. 4E. The mask 421 may be substantially identical to the mask 405 used to form the first trenches 403 as described above (see FIG. 4A), and the location and size of the openings 423 may substantially correspond to the location and size of the openings 407 in mask 405. In general, the locations of the openings 423 in mask 421 correspond to the locations of the openings 407 in the mask 405 used to form the first trenches 403. In some embodiments, the size of the openings 423 in mask 421 may be different than the size of the openings 407 in mask 405 (e.g., openings 423 may be slightly larger or smaller than openings 407).

Then, the continuous stack 120 may be etched (e.g., using reactive ion etching (RIE)) through the openings 423 in mask 421, stopping at the sacrificial material 415 in the first trenches 403, to form the second trenches 419, as shown in FIG. 4F. The mask 421 may then be removed, as shown in FIG. 4G.

As shown in FIG. 4F, the second trenches 419 each comprise a pair of second trench sidewalls 425 extending from a first (e.g., bottom) end 427 of the trench 419 proximate to the second (e.g., top) end 413 of the first trench 403 to a second (e.g., top) end 429 distal to the second end 413 of the first trench 403. The distance between the second trench sidewalls 425 defines a width of the second trench 419, and the width of the second trench 419 may decrease between the second end 429 and the first end 427 of the trench 419 as shown in FIG. 4F. The second trench 419 may have a width, $W_2$, at the first end 427 of the second trench 419 (i.e., adjacent to the sacrificial material 415 at the second end 413 of the first trench 403). The width $W_1$ of the first trench 403 at the second end 413 of the first trench 403 (see FIG. 4B) may be greater than the width $W_2$ of the second trench 419 at the first end 427 of the second trench 419.

In FIG. 4G, the sacrificial material 415 is removed from the first trenches 403 to form continuous trenches 84a, 84b that extend through the continuous stack 120 (i.e., through the first stack 401 and the second stack 417). The sacrificial material 415 may be removed using any suitable process, such as by selectively etching the sacrificial material 415 through the second trench 419 to remove the sacrificial material 415 (e.g., via a wet chemical etch or ashing if the sacrificial material 415 comprises carbon) from the first trench 403 while leaving the sidewalls 409 and bottom 410 of the first trench 403 substantially intact. The pairs of first and second trench sidewalls 409, 425 may form the sidewalls of the respective continuous trenches 84a, 84b and define a width of the continuous trench, $W_C$. Each continuous trench 84a, 84b may have a depth dimension that extends along a direction between a top 431 of the continuous trench 84a, 84b (i.e., proximate to the upper surface of the continuous stack 120) and a bottom 433 of the continuous trench 84a, 84b (i.e., proximate to the substrate 100). The width $W_C$ of the trench 84a, 84b may be substantially constant or may decrease from the top 431 of the trench to a first depth (i.e., corresponding to the first end 427 of the second trench 419 in FIG. 4F) and may increase between the first depth and a second depth (i.e., corresponding to the second end 413 of the first trench 403 in FIG. 4B), where the second depth is closer to the bottom 433 of the trench 84a, 84b than the first depth. In other words, the width $W_C$ of the continuous trench 84a, 84b initially decreases or remains constant along the depth direction towards the bottom 410/433 of the trench, and then increases along the depth direction, as shown in FIG. 4G. The width of the trench may increase at the transition between the second trench 419 formed through the second stack 417 and the first trench 403 formed through the first stack 401. Thus, at a first depth, the width $W_C$ of the continuous trench may be $W_2$ (i.e., corresponding to the width of the second trench 419 at the first end 427 of the second trench 419 shown in FIG. 4F) and at a second depth closer to the substrate 100 than the first depth, the width $W_C$ of the continuous trench may increase to $W_1$ (i.e., corresponding to the width of the first trench 403 at the second end 413 of the first trench 403 shown in FIG. 4B).

FIGS. 5A-5L illustrate additional processing steps that may be performed to at least partially remove the layers 21 of the second material from the stack 120 and form control gate electrodes 3 and conductive source lines 102 for a vertical NAND memory string 150. FIG. 5A illustrates a memory device that is similar to the memory device shown in FIG. 4G. The device of FIG. 5A includes a stack 120 of alternating layers of a first material 19 and a second material 21 over the major surface 100a of a substrate 100, and a plurality of NAND memory strings 150 extending through the stack 120 in a direction that is substantially perpendicular to the major surface 100a of the substrate 100. FIG. 5A also illustrates a pair of continuous trenches 84a, 84b that extend through the stack 120 to the substrate 100, wherein the trenches 84a, 84b define an active memory cell area 200 between the trenches, and the NAND strings 150 are located in the active memory cell area 200. The trenches 84a, 84b in this embodiment are shaped as described above with reference to FIG. 4G (i.e., a width of the trench increases along the depth of the trench, as described above), although it will be understood that the trenches 84a, 84b, may have a different shape (e.g., such that the width of the trench is constant or decreases over the entire depth of the trench).

FIG. 5A illustrates the NAND strings 150 in the respective memory holes 81 including at least one memory film 501 (e.g., a tunnel dielectric layer 7, a charge trap/floating gate layer 9 and/or a blocking dielectric layer 11 as shown in FIGS. 1A-2) extending over the sidewalls of the memory holes 81 and the semiconductor channel 1 extending generally perpendicular to the major surface 100a of the substrate 100 and over the at least one memory film 501, such that the at least one memory film 501 is located between the semiconductor channel 1 and the sidewall of the memory hole 81. FIG. 5A further illustrates an insulating material core 2 (see FIGS. 1A-1B) within each memory hole 81. An insulating cover layer 502 (e.g., silicon oxide) may be located over the stack 120.

FIG. 5A further illustrates a second semiconductor channel portion 503 that extends in a generally horizontal direction parallel to the major surface 100a of the substrate 100. In this embodiment, the second semiconductor channel portion 503 is located within the substrate 100, and is located between at least one memory film 501 and the insulating material core 2. In other embodiments, the second semiconductor channel portion 503 may be located on or over the major surface 100a of the substrate, and the at least one memory film 501 and the insulating material core 2 may not extend in a generally horizontal direction adjacent to the second semiconductor channel portion 503. As discussed above, the vertically extending semiconductor channel 1 (i.e., first semiconductor channel portion) located in a memory hole 81 may be electrically connected to the horizontally extending second semiconductor channel portion 503 in a location of a lower (e.g., source) select gate transistor. In other words, the select gate transistor may be located between the second semiconductor channel portion 503 and the memory levels of the NAND string 150. For clarity, the lower (e.g., source) select gate transistors are not shown in FIGS. 5A-5L.

In FIG. 5B, the substrate 100 may be etched through the trenches 84a, 84b, such as via reactive ion etching (RIE), to expose the at least one memory film 501 located over a region 505 of the second semiconductor channel portion 503 at the bottom of each trench 84a, 84b. The regions 505 may be regions of the second semiconductor channel portions 503 that will later be implanted to form doped source regions which contact conductive source lines formed in the trenches 84a, 84b, as discussed below.

In FIG. 5C, a protective liner material 507 is formed over at least the the sidewalls of the trenches 84a, 84b. The protective liner material 507 may comprise silicon nitride, for example, and may be deposited such that the protective liner material 507 preferentially forms on the sidewalls of the trenches 84a, 84b but not on the bottoms of the trenches 84a, 84b. The protective liner material 507 may also be formed over the insulating cover layer 502 on the top of the stack 120, as shown in FIG. 5C. The protective liner material 507 may remain over and protect the sidewalls of the trenches 84a, 84b from being etched during a subsequent etching step, similar to sidewall spacer formation during anisotropic etching.

In FIG. 5D, the at least one memory film 501 and optionally any protective liner material 507 at the bottom 410 of the trenches 84a, 84b is etched to expose the regions 505 of the second semiconductor channel portion 503. An anisotropic etching process may be used, such as reactive ion etching (RIE), so that generally horizontally extending materials, such as the at least one memory film 501 at the bottom of the trenches 84a, 84b and the protective liner material 507 over the insulating cover layer 502, are preferentially etched relative to generally vertically-extending materials, such as the protective liner material 507 over the sidewalls of the trenches 84a, 84b. Thus, the protective liner material 507 may protect the trench sidewalls from etching damage during the etching step.

In FIG. 5E, ion implantation is performed through the trenches 84a, 84b to form source regions 508 in the exposed regions 505 of the second semiconductor channel portion 503. The ion implantation may be followed by an activation anneal step. The source regions 508 may be doped opposite conductivity type (e.g., n-type) from the conductivity type (e.g., p-type) of the second semiconductor channel portion 503.

In FIG. 5F, the protective liner material 507 may be removed from the trench sidewalls, such as via a selective wet chemical etch.

In FIG. 5G, a bottom portion of each trench 84a, 84b is filled with a protective material 509. The protective material 509 may comprise an insulating material, such as an oxide material (e.g., silicon oxide), that covers the source regions 508 of the second semiconductor channel portion 503 and partially fills the trenches 84a, 84b at the bottoms of the trenches, but is preferably not located in the trenches 84a, 84b adjacent to the memory levels 70 (i.e., the portion of the stack 120 in which control gate electrodes are subsequently formed). In embodiments, the protective material 509 may be deposited in the trenches 84a, 84b such that the material 509 preferentially deposits on the bottom of the trench but not on the sidewalls of the trench adjacent to the memory levels 70. Alternately, the protective material 509 may be deposited such that the protective material 509 overfills the bottom portions of the trenches 84a, 84b (i.e., a portion of the protective material 509 is located adjacent to the memory levels 70) and the protective material 509 may then be etched back or recessed through the trenches 84a, 84b to remove the protective material 509 adjacent to the memory levels 70, leaving only the bottom portions of the trenches 84a, 84b filled with the protective material 509.

In FIG. 5H, portions of the second material layers 21 of the stack 120 are removed through the trenches 84a, 84b form back side recesses 511 between the first material layers 19. The portions of the second material layers 21 may be removed by selective etching, such as polysilicon selective etching which removes the polysilicon material of the second material layers 21 but does not remove the silicon oxide material of the first material layers 19. The protective material 509 at the bottoms of the trenches 84a, 84b may protect the source region 508 in the second semiconductor channel portion 503 from being etched.

In the embodiment of FIG. 5H, only a portion of the second material layers 21 are selectively removed from the stack 120 during the etching. Preferably, the second material layers 21 are completely removed in the memory levels 70 from the active memory cell area 200 defined between the trenches 84a, 84b. Within the active memory cell area 200, the second material layers 21 may be completely removed by selective etching, and the selective etch may stop on the at least one memory film 501 (e.g., an oxide blocking dielectric 7, such as a silicon oxide blocking dielectric, as shown in FIGS. 1A-2) that extends vertically in the memory openings 81. Outside of the active memory cell area 200 (i.e., on the sides of the trenches 84a, 84b opposite the active memory cell area 200), at least a portion of the second material layers 21 is not removed, as shown in FIG. 5H.

Electrically conductive control gate electrodes 3 may then be formed in the back side recesses 511 through the trenches 84a, 84b, as shown in FIG. 5I. The control gate electrode 3 material may comprise any suitable material described above with respect to FIGS. 1A-2. For example, the material may comprise a TiN liner and tungsten gate material. The electrodes 3 may be formed by forming the electrically conductive control gate electrode material to partially or completely fill the trenches 84a, 84b and to fill the back side recesses 511 such that the control gate electrode 3 material contacts the at least one memory film 501 (i.e., blocking dielectric 7) along the sidewalls of the memory openings 81. The electrically conductive control gate material may be formed using any suitable technique, such as by chemical vapor deposition (CVD). The electrode material may then be removed from the trenches 84a, 84b (e.g., using anisotropic etching) without removing the material forming the electrodes 3 from the recesses 511.

Thus, within the active memory cell area 200, the stack 120 comprises alternating layers 19, 3 of the first material (e.g., an insulating material, such as silicon oxide) and a conductive material (e.g., a metal, metal silicide or metal nitride material, such as tungsten, tungsten silicide, tungsten nitride, titanium, titanium silicide or titanium nitride). The conductive material forms a plurality of conductive control gate electrodes 3 that extend adjacent to the at least one memory film 501 in each of the NAND memory strings 150. Outside of the active memory cell area 200, at least a portion of the stack 120 comprises alternating layers 19, 21 of the first material and an additional material that is different from the first material and the conductive gate electrode material (e.g., the additional material may be a semiconductor material, such as polysilicon).

Then, as shown in FIG. 5J, an insulating layer 517, such as a silicon oxide or silicon nitride layer, is formed over the stack 120, including over the insulating cover layer 502 and within the trenches 84a, 84b, including over the trench sidewalls and over the protective material 509 at the bottom of the trenches 84a, 84b. In FIG. 5K, the insulating layer 517 and the protective material 509 are etched from the bottoms of the trenches 84a, 84b to expose the source regions 508 of the second semiconductor channel portion 503. Portions of the insulating layer 517 and the protective material 509 remain over the sidewalls of the trenches 84a, 84b, as shown in FIG. 5K.

In FIG. 5L, a conductive source line 102 (e.g., a metal or metal nitride line, such as W, Ti, TiN, etc.) is then formed over the insulating layer 517 and the protective material 509 in each of the trenches 84a, 84b such that the source line 120 contacts a source region 508 of the second semiconductor channel portion 503. The source line 120 is electrically isolated from the control gate electrodes 3 by the insulating layer 517 and protective material 509 along the sidewalls of the trench 84a, 84b.

FIGS. 6A-6K illustrate an alternative method of forming control gate electrodes 3 and conductive source lines 102 for a vertical NAND memory string 150. FIG. 6A corresponds to FIG. 5A, and shows a plurality of NAND memory strings 150 extending through a stack 120 in a direction that is substantially perpendicular to the major surface 100a of the substrate 100. FIG. 6A also shows a pair of continuous trenches 84a, 84b that extend through the stack 120 to the substrate 100, wherein the trenches 84a, 84b define an active memory cell area 200 between the trenches, and the NAND strings 150 are located in the active memory cell area 200. The trenches 84a, 84b in this embodiment are shaped as described above with reference to FIG. 4G (i.e., a width of the trench increases along the depth of the trench, as described above), although it will be understood that the trenches 84a, 84b, may have a different shape (e.g., such that the width of the trench is constant or decreases over the entire depth of the trench).

The stack 120 in FIG. 6A differs from the stack 120 in FIG. 5A in that instead of alternating layers of a first insulating (e.g., an oxide, such as silicon oxide) material 19 and a second semiconductor (e.g., silicon, such as polysilicon) material 21 (e.g., an OPOP stack) shown in FIG. 5A, the stack 120 of FIG. 6A includes alternating layers of a first insulating (e.g., an oxide, such as silicon oxide) material 19 and a second sacrificial (e.g., a nitride, such as silicon nitride) material 121 different from the first material (e.g., an ONON stack).

FIGS. 6B-6E substantially correspond to FIGS. 5B-5E described above, and illustrate etching the substrate 100 through the trenches 84a, 84b to expose the at least one memory film 501 located over a region 505 of the second semiconductor channel portion 503 at the bottom of each trench 84a, 84b (FIG. 6B), forming a protective liner material 507 (e.g., silicon nitride) over at least the sidewalls of the trenches 84a, 84b (FIG. 6C), etching the at least one memory film 501 through the trenches 84a, 84b to expose regions 505 of the second semiconductor channel portion 503 while the protective liner material 507 protects the trench sidewalls from etching damage (FIG. 6D), and performing ion implantation through the trenches 84a, 84b to form source regions 508 in the exposed regions 505 of the second semiconductor channel portion 503 (FIG. 6E). Preferably, the liner material 507 comprises the same material (e.g., silicon nitride) as the second sacrificial layer 121 material.

In the embodiment of FIGS. 6A-6K, the separate step of removing the protective liner material 507 from the trenches 84a, 84c (e.g., via wet etching) as shown in FIG. 5E prior to filling the bottoms of the trenches 84a, 84b with a protective material 509 may be omitted. Thus, the protective material 509 may be formed in the bottoms of the trenches 84a, 84b and over the exposed source regions 508 while the protective liner material 507 remains over the sidewalls of the trenches 84a, 84b, as shown in FIG. 6F. The protective material 509 may be an oxide material (e.g., silicon oxide) which is different from the nitride material of layers 121 and 507 and may be deposited over the bottoms of the trenches 84a, 84b via CVD using a tetraethyl orthosilicate (TEOS) source.

In FIG. 6G, the protective liner material 507 and the second layers 121 of sacrificial material are removed through the trenches 84a, 84b form back side recesses 511 between the first material layers 19. The protective liner material 507 and the second layers 121 may be completely removed by selective etching, such as silicon nitride selective etching which removes the silicon nitride material of the protective liner material 507 and the second layers 121 in the same step but does not remove the silicon oxide material of the first material layers 19 and the protective material 509. The protective material 509 at the bottoms of the trenches 84a, 84b may protect the source region 508 in the second semiconductor channel portion 503 from being etched.

Unlike in the embodiment of FIGS. 5A-5L in which only a portion of the second material layers 21 are selectively removed from the stack 120 during the etching, preferably the second layers 121 of sacrificial material are completely removed from the stack 120, including from the active memory cell area 200 defined between the trenches 84a, 84 as well as from outside of the active memory cell area 200, as shown in FIG. 6G. In embodiments, one or more support columns of a suitable material (e.g., an insulating material, such as silicon oxide or another material that is not etched with the sacrificial material) may be formed through the stack 120 (e.g., outside of the view of FIG. 6G) to support the stack layers after the sacrificial layer 121 are removed. For clarity, the one or more support column is not shown in FIG. 6G. An exemplary support column and method of fabricating a support column is described and illustrated with reference to FIGS. 44-46 of U.S. application Ser. No. 14/133,979, which is incorporated by reference herein. It will be understood that one or more support columns may also be formed to support the stack layers after the second material layers 21 are partially etched in the embodiment of 5A-5L.

Thus, as shown in FIG. 6G, the second layers 121 of sacrificial material are removed both from within the active memory cell area 200 and from outside of the active memory cell area 200 (i.e., on the sides of the trenches 84a, 84b opposite the active memory cell area 200). The sacrificial material layers 121 may be removed by selective etching, as described above, and within the active memory cell area 200, the etching may stop on the at least one memory film 501 (e.g., an oxide blocking dielectric 7, such as a silicon oxide blocking dielectric, as shown in FIGS. 1A-2) that extends vertically in the memory openings 81.

Electrically conductive control gate electrodes 3 may then be formed in the back side recesses 511 through the trenches 84a, 84b, as shown in FIG. 6H. The electrically conductive control gate electrodes 3 may be formed as described above with reference to FIG. 5I. Thus, both within the active memory cell area 200 and outside of the active memory cell area 200, the stack 120 comprises alternating layers 19, 3 of the first material (e.g., an insulating material, such as silicon oxide) and a conductive material (e.g., a metal, metal silicide or metal nitride material, such as tungsten, tungsten silicide, tungsten nitride, titanium, titanium silicide or titanium nitride). Within the active memory cell area 200, the conductive material forms a plurality of conductive control gate electrodes 3 that extend adjacent to the at least one memory film 501 in the memory levels 70 of each of the NAND memory strings 150. Outside of the active memory cell area 200, the layers of sacrificial material 121 are completely removed and the stack 120 comprises alternating layers 19, 3 of the first material and the conductive material.

Although the method of control gate electrode 3 formation of FIGS. 6A-6H is described with reference to a stack 120 comprising alternating layers 19 of a first insulating (e.g., an oxide, such as silicon oxide) and a second sacrificial (e.g., a nitride, such as silicon nitride) material 121 (e.g., an ONON stack), it will be understood that the method may also be used with a stack 120 that includes alternating layers of a first insulating (e.g., an oxide, such as silicon oxide) material 19 and a second semiconductor (e.g., silicon, such as polysilicon) material 21 (e.g., an OPOP stack), as shown in FIG. 5A. Thus, the second layers 21 of semiconductor material (e.g., polysilicon) may be completely removed from the stack 120 and replaced with a conductive material (e.g., a metal or metal nitride) that forms a control gate electrode 3 for the NAND memory strings 150.

FIG. 6I substantially corresponds to FIG. 5J, described above, and illustrates the formation of an insulating layer 517, such as a silicon oxide or silicon nitride layer, formed over the trench sidewalls and over the protective material 509 at the bottom of the trenches 84a, 84b. FIG. 6J corresponds to FIG. 5K, described above, and illustrates etching the insulating layer 517 and the protective material 509 from the bottoms of the trenches 84a, 84b to expose the source regions 508 of the second semiconductor channel portion 503, while portions of the insulating layer 517 and the protective material 509 remain over the sidewalls of the trenches 84a, 84b.

FIG. 6K corresponds to FIG. 5L, described above, and shows a conductive source line 102 (e.g., a metal or metal nitride line, such as W, Ti, TiN, etc.) formed over the insulating layer 517 and the protective material 509 in each of the trenches 84a, 84b such that the source line 120 contacts a source region 508 of the second semiconductor channel portion 503. The source line 120 is electrically isolated from the control gate electrodes 3 by the insulating layer 517 and protective material 509 along the sidewalls of the trench 84a, 84b.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of fabricating a memory device, comprising:
    forming a first stack of alternating layers of a first material and a second material different from the first material over a substrate;
    removing a portion of the first stack to form a first trench;
    filling the trench with a sacrificial material;
    forming a second stack of alternating layers of the first material and the second material over the first stack and the sacrificial material;
    removing a portion of the second stack to the sacrificial material to form a second trench;
    removing the sacrificial material to form a continuous trench through the first stack and the second stack; and
    forming a select line comprising an electrically conductive material in the continuous trench.

2. The method of claim 1, wherein removing a portion of the first stack to form the first trench comprises etching the alternating layers of the first material and the second material to form a pair of first trench sidewalls in the first stack extending from a first end proximate to the substrate to a second end distal to the substrate, and a distance between the first trench sidewalls defines a width of the first trench, and wherein removing a portion of the second stack to form the second trench comprises etching the alternating layers of the first material and the second material to the sacrificial material to form a pair of second trench sidewalls in the second stack extending from a first end proximate to the second end of the first trench to a second end distal to the second end of the first trench, and a distance between the second trench sidewalls defines a width of the second trench, and the width of the first trench at the second end of the first trench is greater than the width of the second trench at the first end of the second trench.

3. The method of claim 2, wherein the width of the first trench decreases between the second end and the first end of the first trench.

4. The method of claim 3, wherein the width of the first trench at the second end of the first trench is configured to compensate for misalignment of the first end of the second trench during a high aspect ratio trench etch.

5. The method of claim 2, wherein the width of the second trench decreases between the second end and the first end of the second trench.

6. The method of claim 1, wherein the sacrificial material comprises at least one of silicon nitride, silicon oxide, undoped carbon, doped carbon, amorphous carbon, polycrystalline carbon, and undoped polysilicon.

7. The method of claim 1, wherein the continuous trench forms a first boundary of an active memory cell area.

8. The method of claim 7, wherein a second continuous trench forms a second boundary of the active memory cell area.

9. The method of claim 8, wherein the active memory cell area comprises a plurality of NAND memory strings extending through the first stack and the second stack, wherein each NAND memory string comprises:
 a semiconductor channel which comprises at least a first portion that extends substantially perpendicular to a major surface of the substrate; and
 at least one memory film located adjacent to the semiconductor channel.

10. The method of claim 9, wherein the at least one memory film comprises a blocking dielectric, a charge trapping layer or floating gate, and a tunnel dielectric, and the memory film is located between the semiconductor channel and at least one of the first material and the second material in the first and second stacks.

11. The method of claim 9, wherein the memory device further comprises a second semiconductor channel portion which extends substantially parallel to the major surface of the substrate above or in the substrate.

12. The method of claim 1, wherein the sacrificial material comprises a dielectric material.

13. The method of claim 1, wherein the select line comprises a metal or metal nitride source line.

14. A method of fabricating a memory device, comprising:
 forming a first stack of alternating layers of a first material and a second material different from the first material over a substrate;
 removing a portion of the first stack to form a first trench;
 filling the trench with a sacrificial material;
 forming a second stack of alternating layers of the first material and the second material over the first stack and the sacrificial material;
 removing a portion of the second stack to the sacrificial material to form a second trench;
 removing the sacrificial material to form a continuous trench through the first stack and the second stack;
 wherein the continuous trench forms a first boundary of an active memory cell area;
 wherein a second continuous trench forms a second boundary of the active memory cell area;
 wherein the active memory cell area comprises a plurality of NAND memory strings extending through the first stack and the second stack, wherein each NAND memory string comprises:
  a semiconductor channel which comprises at least a first portion that extends substantially perpendicular to a major surface of the substrate; and
  at least one memory film located adjacent to the semiconductor channel:
 wherein the memory device further comprises a second semiconductor channel portion which extends substantially parallel to the major surface of the substrate above or in the substrate;
 wherein the second semiconductor channel portion is electrically connected to the at least one semiconductor channel in the plurality of NAND strings, and a second memory film portion extends substantially parallel to the major surface of the substrate and is located between the second semiconductor channel portion and a bottom surface of the first and second continuous trenches, the method further comprising:
 etching through the bottom surface of the continuous trenches to expose the second memory film portion;
 forming a sacrificial material over the sidewalls of the continuous trenches; and
 etching a portion of the sacrificial material and the second memory film portion at the bottom of the continuous trenches to expose the second semiconductor channel portion.

15. The method of claim 14, further comprising:
performing ion implantation through the continuous trenches to provide doped source regions in the second semiconductor channel portion.

16. The method of claim 15, further comprising:
removing a remaining portion of the sacrificial material to expose the sidewalls of the continuous trenches.

17. A method of fabricating a memory device, comprising:
 forming a first stack of alternating layers of a first material and a second material different from the first material over a substrate;
 removing a portion of the first stack to form a first trench;
 filling the trench with a sacrificial material;
 forming a second stack of alternating layers of the first material and the second material over the first stack and the sacrificial material;
 removing a portion of the second stack to the sacrificial material to form a second trench;
 removing the sacrificial material to form a continuous trench through the first stack and the second stack;
 wherein the continuous trench forms a first boundary of an active memory cell area;
 wherein a second continuous trench forms a second boundary of the active memory cell area;

wherein the active memory cell area comprises a plurality of NAND memory strings extending through the first stack and the second stack, wherein each NAND memory string comprises:
- a semiconductor channel which comprises at least a first portion that extends substantially perpendicular to a major surface of the substrate; and
- at least one memory film located adjacent to the semiconductor channel;

wherein the memory device further comprises a second semiconductor channel portion which extends substantially parallel to the major surface of the substrate above or in the substrate;

wherein the continuous trenches extend to the second semiconductor channel portion, the method further comprising:

filling a bottom portion of the continuous trenches with a protective material;

etching the stack through the continuous trenches to remove the alternating layers of the second material from at least the active memory cell area and form recesses between the alternating layers of the first material;

forming an electrically conductive material in the continuous trenches and within the recesses to form control gate electrodes adjacent to the memory film in each of the NAND strings; and removing the electrically conductive material from the continuous trenches.

18. The method of claim 17, wherein the alternating layers of the second material comprise a sacrificial material, the alternating layers of the first material comprise an insulating material, and the electrically conductive material comprises at least one of a metal and a metal nitride.

19. The method of claim 18, wherein the second material comprises at least one of polysilicon and silicon nitride, the first material comprises an oxide and the electrically conductive material comprises at least one of tungsten, tungsten nitride, titanium and titanium nitride.

20. The method of claim 17, wherein the alternating layers of the second material are not completely removed outside of the active memory cell area.

21. The method of claim 20, wherein the control gate electrodes comprise at least one of a metal, metal silicide or a metal nitride inside the memory cell area and polysilicon and the at least one of the metal, metal silicide or the metal nitride outside of the memory cell area.

22. The method of claim 17, further comprising:
depositing an insulating material over the sidewalls of the continuous trenches and the protective material at the bottom of the trenches.

23. The method of claim 22, further comprising:
etching through the insulating material and the protective material to expose source regions of the second semiconductor channel portion while leaving the insulating material on the trench sidewalls.

24. The method of claim 23, wherein the insulating material and the protective material comprise an oxide material.

25. The method of claim 23, further comprising:
filling at least one of the continuous trenches with an electrically conductive source line such that the source line contacts a source region in the second semiconductor channel portion and the insulating material is positioned between the source line and the control gate electrodes along a sidewall of the continuous trench.

26. The method of claim 25, wherein the source line comprises at least one of titanium, titanium nitride, tungsten and tungsten nitride.

27. The method of claim 25, wherein each of the NAND memory strings comprises a source select transistor that comprises a third semiconductor channel portion that is electrically connected at a first end to the semiconductor channel portion of the NAND string that extends substantially perpendicular to a major surface of the substrate and is electrically connected at a second end to the source line via the source region and the second semiconductor portion that extends substantially parallel to the major surface of the substrate, and the source select transistor further comprises a select gate electrode and a gate insulating layer that is located between the select gate electrode and the third semiconductor channel portion.

28. The method of claim 27, wherein each of the NAND memory strings further comprises a drain select gate electrode on a top side of the memory device.

* * * * *